United States Patent
Zhang et al.

(10) Patent No.: US 11,139,224 B2
(45) Date of Patent: Oct. 5, 2021

(54) PACKAGE COMPRISING A SUBSTRATE HAVING A VIA WALL CONFIGURED AS A SHIELD

(71) Applicant: QUALCOMM Incorporated, San Diego, CA (US)

(72) Inventors: Chaoqi Zhang, San Diego, CA (US); Rajneesh Kumar, San Diego, CA (US); Li-Sheng Weng, San Diego, CA (US); Darryl Sheldon Jessie, San Diego, CA (US); Suhyung Hwang, Rancho Mission Viejo, CA (US); Jeahyeong Han, San Diego, CA (US); Xiaoming Chen, San Diego, CA (US); Jaehyun Yeon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 13 days.

(21) Appl. No.: 16/704,789

(22) Filed: Dec. 5, 2019

(65) Prior Publication Data

US 2021/0175152 A1  Jun. 10, 2021

(51) Int. Cl.
| | |
|---|---|
| H01L 23/48 | (2006.01) |
| H01L 23/52 | (2006.01) |
| H01L 29/40 | (2006.01) |
| H01L 21/56 | (2006.01) |
| H01L 21/67 | (2006.01) |
| H01L 23/31 | (2006.01) |

(52) U.S. Cl.
CPC ............ *H01L 23/481* (2013.01); *H01L 21/56* (2013.01); *H01L 21/67121* (2013.01); *H01L 23/3114* (2013.01)

(58) Field of Classification Search
CPC combination set(s) only.
See application file for complete search history.

(56) References Cited

U.S. PATENT DOCUMENTS

| | | | |
|---|---|---|---|
| 2010/0319982 A1 | 12/2010 | Cho et al. | |
| 2012/0015687 A1* | 1/2012 | Yamada | H01L 23/49827 455/550.1 |
| 2012/0086109 A1* | 4/2012 | Kim | H01L 21/561 257/659 |
| 2015/0170980 A1* | 6/2015 | Kosaka | H01L 24/97 257/48 |
| 2016/0240463 A1 | 8/2016 | Jow et al. | |
| 2017/0179039 A1 | 6/2017 | Lee et al. | |

OTHER PUBLICATIONS

International Search Report and Written Opinion—PCT/US2020/057826—ISA/EPO—dated Jan. 26, 2021.

* cited by examiner

*Primary Examiner* — Niki H Nguyen
(74) *Attorney, Agent, or Firm* — Qualcomm Incorporated

(57) ABSTRACT

A package that includes a substrate having a routing region and a non-routing region along a periphery of the substrate. The non-routing region includes a plurality of vias configured as a shield. The package includes an integrated device coupled to the substrate, and an encapsulation layer located over the substrate such that the encapsulation layer encapsulates the integrated device.

22 Claims, 17 Drawing Sheets

PLAN VIEW

PLAN VIEW

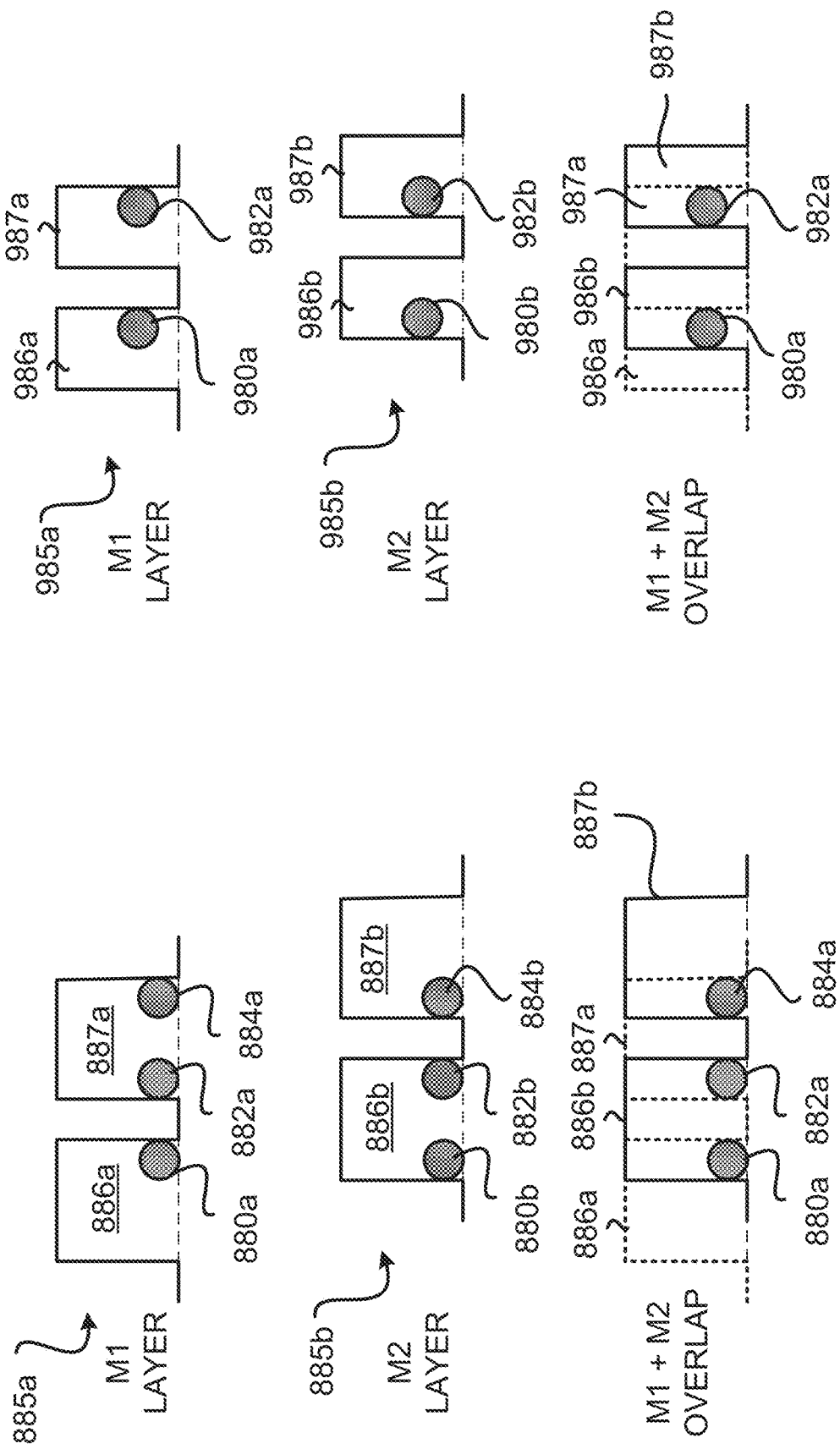

PACKAGE COMPRISING A SUBSTRATE HAVING A VIA WALL CONFIGURED AS A SHIELD

FIELD

Various features relate to packages that include an integrated device, but more specifically to a package that includes an integrated device and a substrate comprising a via wall configured as a shield.

BACKGROUND

FIG. 1 illustrates a package 100 that includes a substrate 102, an integrated device 104, and an encapsulation layer 108. The substrate 102 includes a plurality of dielectric layers 120, a plurality of interconnects 122, and a plurality of solder interconnects 124. A plurality of solder interconnects 144 is coupled to the substrate 102 and the integrated device 104. The encapsulation layer 108 encapsulates the integrated device 104 and the plurality of solder interconnects 144. Components inside the package may be sensitive and subject to interference, which can affect the performance of the components and the package. There is an ongoing need to provide better performing packages.

SUMMARY

Various features relate to packages that include an integrated device, but more specifically to a package that includes an integrated device and a substrate comprising a via wall configured as a shield.

One example provides a package that includes a substrate having a routing region and a non-routing region along a periphery of the substrate. The non-routing region includes a plurality of vias configured as a shield. The package includes an integrated device coupled to the substrate, and an encapsulation layer located over the substrate such that the encapsulation layer encapsulates the integrated device.

Another example provides an apparatus that includes a substrate comprising a routing region and a non-routing region along a periphery of the substrate. The non-routing region includes means for via shielding. The apparatus includes an integrated device coupled to the substrate, and means for encapsulation located over the substrate such that the means for encapsulation encapsulates the integrated device.

Another example provides a method for fabricating a package. The method provides a substrate. The substrate includes a routing region and a non-routing region along a periphery of the substrate. The non-routing region includes a plurality of vias configured as a shield. The method couples an integrated device to the substrate. The method forms an encapsulation layer over the substrate such that the encapsulation layer encapsulates the integrated device.

BRIEF DESCRIPTION OF THE DRAWINGS

Various features, nature and advantages may become apparent from the detailed description set forth below when taken in conjunction with the drawings in which like reference characters identify correspondingly throughout.

FIG. 8 illustrates a plan view of a via wall and a fin structure configured as a shield.

FIG. 9 illustrates a plan view of a via wall and a fin structure configured as a shield.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate having (i) a routing region and (ii) a non-routing region along a periphery of the substrate. The non-routing region includes a plurality of vias configured as a shield (e.g., electromagnetic interference (EMI) shield). The package includes an integrated device coupled to the substrate, and an encapsulation layer located over the substrate such that the encapsulation layer encapsulates the integrated device. The plurality of vias is configured to be free of electrical connection with the integrated device. The non-routing region may further include a fin structure coupled to the plurality of vias. The package may include a metal layer located over a side portion of the substrate such that the metal layer is coupled to the fin structure and/or the plurality of vias located in the non-routing region of the substrate. The metal layer, the fin structure and/or the plurality of vias may be configured as a shield for the package. This configuration utilizes a space and/or region of the package that was previously not used, to provide more effective shielding for the package without increasing the overall size and/or footprint of the package.

Figure 1:
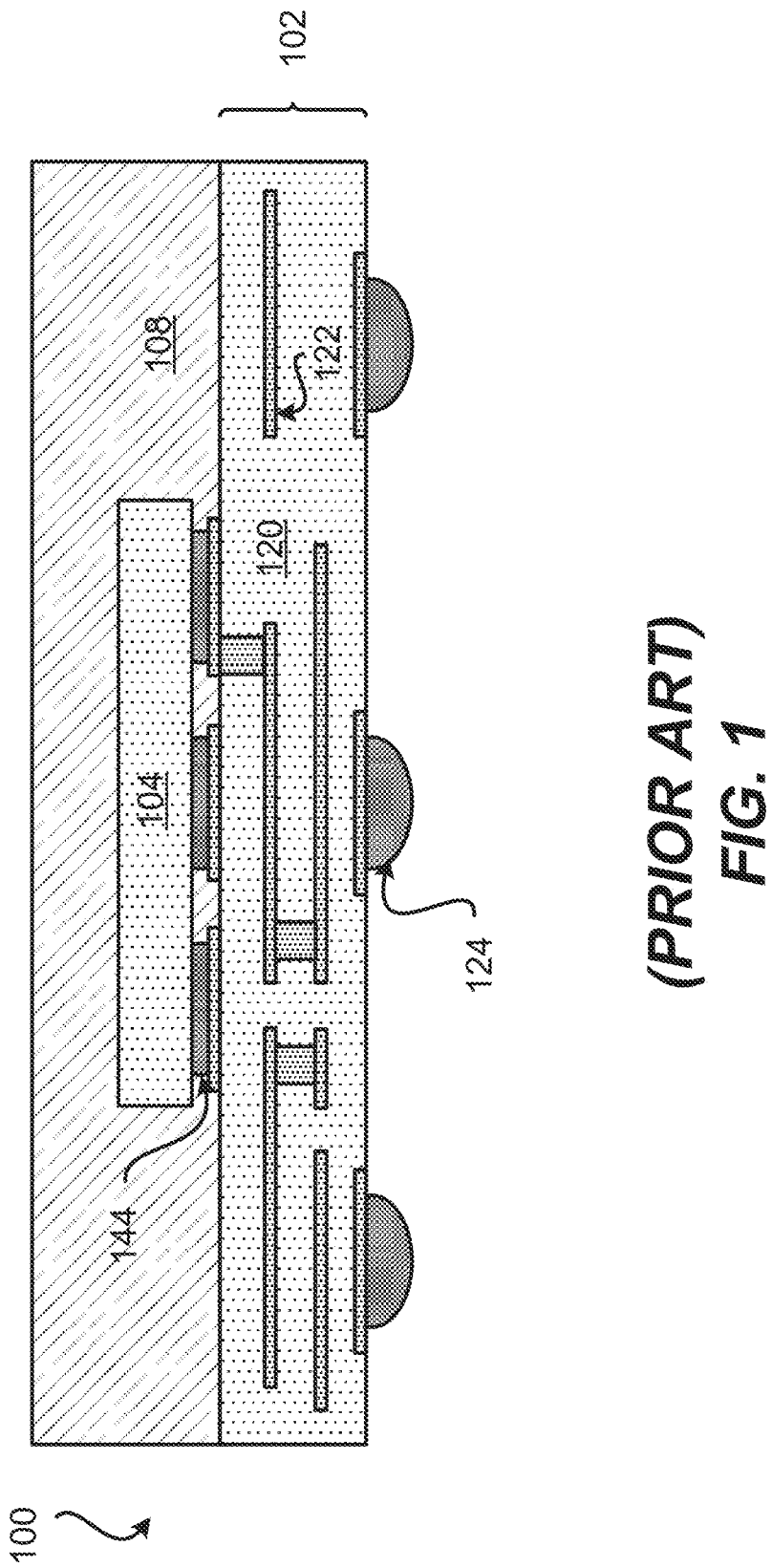
FIG. 1 illustrates a profile view of a package that includes an integrated device and a substrate.
Figure 2:
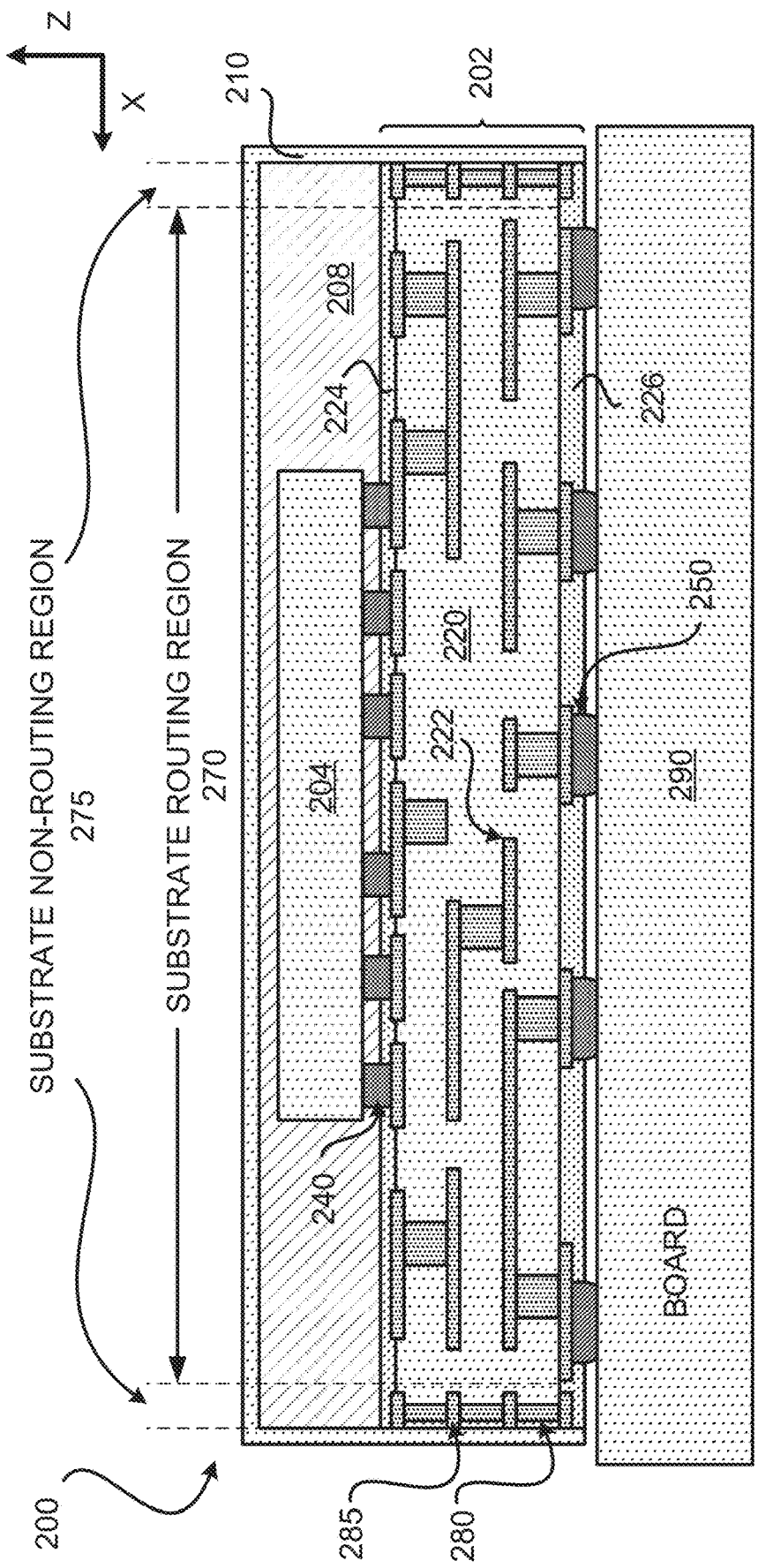
FIG. 2 illustrates a profile view of a package that includes a substrate having a via wall configured as a shield.

Exemplary Package Comprising a Substrate Having a Via Wall and Fin Structure Configured as a Shield FIG. 2 illustrates a profile view of a package 200 that includes a substrate having a via wall and a fin structure configured as a shield (e.g., electromagnetic interference (EMI) shield) for the package 200. The package 200 is coupled to a board 290 (e.g., printed circuit board (PCB)) through a plurality of solder interconnects 250. The package 200 may include a metal layer (e.g., external metal layer) that is located over the side portion of the substrate and over a surface of an encapsulation layer. The metal layer may also be configured as a shield (e.g., EMI shield) for the package 200.

As shown in FIG. 2, the package 200 includes a substrate 202, an integrated device 204, an encapsulation layer 208, and a metal layer 210. The substrate 202 includes at least one dielectric layer 220, a plurality of interconnects 222, a first solder resist layer 224 and a second solder resist layer 226.

The substrate 202 includes a routing region 270 and a non-routing region 275. The non-routing region 275 is located along a periphery of the substrate 202. The non-routing region 275 of the substrate 202, includes a plurality of vias 280 configured as a shield (e.g., EMI shield). The non-routing region 275 of the substrate 202, also includes a fin structure 285 that is coupled to the plurality of vias 280. The routing region 270 of the substrate 202, includes the plurality of interconnects 222. The plurality of vias 280 is configured to be free of electrical connection with the integrated device 204. The plurality of vias 280 may configured to be free of electrical connection with the plurality of interconnects 222. The plurality of vias 280 may be configured as a via wall. The plurality of vias 280 may be a means for via shielding (e.g., via EMI shielding). The fin structure 285 may be configured as a shield. The fin structure 285 may be a means for fin shielding (e.g., fin EMI shielding). As will be further described below, the fin structure 285 may be formed on one or more metal layers of the substrate 202. Examples of fin structures are further described below in at least FIGS. 6-10.

The substrate 202 may be a laminate substrate. The substrate 202 includes at least one dielectric layer 220 that is located in the routing region 270 and the non-routing region 275. The routing region 270 of the substrate 202, may include one or more continuous and/or contiguous regions of the substrate 202 that includes the plurality of interconnects 222. The plurality of interconnects 222 is configured to be electrically coupled to the integrated device 204. The non-routing region 275 may include one or more continuous and/or contiguous regions located along the periphery of the substrate 202, where one or more continuous and/or contiguous regions is free of interconnects configured to be electrically coupled to the integrated device 204. The non-routing region 275 may laterally surround the routing region 270. Various examples of designs and/or configurations for the plurality of vias 280 and the fin structure 285 located in the non-routing region 275 will be further described below in detail.

The integrated device 204 is coupled to the substrate 202. In particular, the integrated device 204 may be coupled to the substrate 202 through the plurality of solder interconnects 240. In some implementations, pillars (e.g., copper pillars) may be used in conjunction with or instead of the plurality of solder interconnects 240, to couple the integrated device 204 with the substrate 202. The plurality of solder interconnects 240 may be coupled to the plurality of interconnects 222 of the substrate 202. The integrated device 204 may include a die (e.g., bare die). The integrated device 204 may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon carbide (SiC) based integrated device, and/or combinations thereof.

The encapsulation layer 208 is located over the substrate 202 such that the encapsulation layer 208 encapsulates the integrated device 204. The encapsulation layer 208 may be a means for encapsulation. The encapsulation layer 208 may include a mold, a resin, an epoxy and/or polymer.

The metal layer 210 is located over a side portion of the substrate 202 and a surface of the encapsulation layer 208. The metal layer 210 may include an electrically conductive material. The metal layer 210 may be formed over the side portion of the substrate 202 and the surface (e.g., outer surface) of the encapsulation layer 208 through a sputtering process. The metal layer 210 may be coupled to the at least one dielectric layer 220, the plurality of vias 280 and/or the fin structure 285. The metal layer 210, the plurality of vias 280 and/or the fin structure 285 may be configured as a shield (e.g., EMI shield) for the package 200. In some implementations, the metal layer 210, the plurality of vias 280 and/or the fin structure 285 may be configured to couple to ground. In some implementations, the metal layer 210, the plurality of vias 280 and/or the fin structure 285 may help provide at least −34 dB of isolation for the package 200. The package 200 may include an antenna in package.

As mentioned above, the package 200 (or any of the packages having a substrate with via walls and/or fin structures) provides an improved package by utilizing a space and/or region of the package that was previously not used, to provide more effective shielding for the package 200 without increasing the overall size and/or footprint of the package 200.

Figure 3:
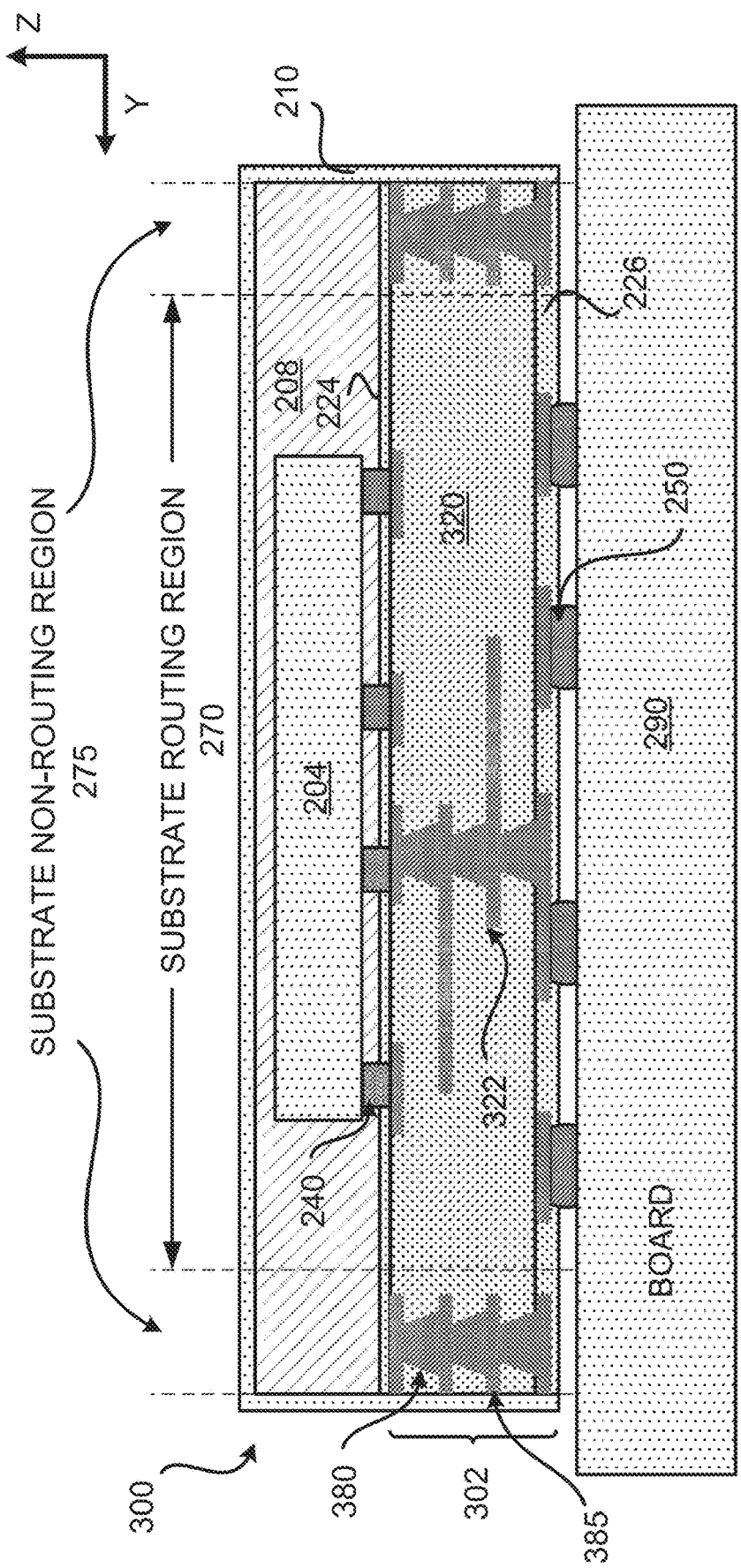
FIG. 3 illustrates a profile view of another package that includes a substrate having a via wall configured as a shield.

FIG. 3 illustrates another package that includes a substrate having a via wall and a fin structure configured as shield. The package 300 of FIG. 2 is similar to the package 200 of FIG. 2, and includes similar components as the package 200.

As shown in FIG. 3, the package 300 includes a substrate 302, the integrated device 204, the encapsulation layer 208, and the metal layer 210. The substrate 302 includes at least one dielectric layer 320, a plurality of interconnects 322, the first solder resist layer 224 and the second solder resist layer 226.

The substrate 302 includes a routing region 270 and a non-routing region 275. The non-routing region 275 is located along a periphery of the substrate 302. The non-routing region 275 of the substrate 302, includes a plurality of vias 380 configured as a shield (e.g., EMI shield). The non-routing region 275 of the substrate 302, also includes a fin structure 385 that is coupled to the plurality of vias 380. The routing region 270 of the substrate 302, includes the plurality of interconnects 322. The plurality of vias 380 is configured to be free of electrical connection with the integrated device 204. The plurality of vias 380 may configured to be free of electrical connection with the plurality of interconnects 322. The plurality of vias 380 may be a via wall. The plurality of vias 380 may be a means for via shielding (e.g., via EMI shielding). The plurality of vias 380 is shown to have diagonal walls, which is different than the walls of the plurality of vias 280, which have walls that are substantially vertical. The fin structure 385 may be configured as a shield. As will be further described below, the fin structure 385 may be formed on one or more metal layers of the substrate 302.

The substrate 302 also includes at least one dielectric layer 320 that is located in the routing region 270 and the non-routing region 275. The routing region 270 of the substrate 302, may include one or more continuous and/or contiguous regions of the substrate 302 that includes the plurality of interconnects 322. The plurality of interconnects 322 is configured to be electrically coupled to the integrated device 204. The non-routing region 275 may include one or more continuous and/or contiguous regions located along the periphery of the substrate 302, where one or more continuous and/or contiguous regions is free of interconnects configured to be electrically coupled to the integrated device 204.

The integrated device 204 is coupled to the substrate 302. In particular, the integrated device 204 may be coupled to the substrate 302 through the plurality of solder interconnects 240. In some implementations, pillars (e.g., copper pillars) may be used in conjunction with or instead of the plurality of solder interconnects 240, to couple the integrated device 204 with the substrate 302. The plurality of solder interconnects 240 may be coupled to the plurality of interconnects 322 of the substrate 302. The encapsulation layer 208 is located over the substrate 302 such that the encapsulation layer 208 encapsulates the integrated device 204.

The metal layer 210 is located over a side portion of the substrate 302 and a surface of the encapsulation layer 208. The metal layer 210 may include an electrically conductive material. The metal layer 210 may be formed over the side portion of the substrate 302 and the surface of the encapsulation layer 208 through a sputtering process. The metal layer 210 may be coupled to the at least one dielectric layer 320, the plurality of vias 380 and/or the fin structure 285. The metal layer 210, the plurality of vias 380 and/or the fin structure 385 may be configured as a shield (e.g., EMI shield) for the package 300. In some implementations, the metal layer 210, the plurality of vias 380 and/or the fin structure 385 may be configured to couple to ground. The package 300 may include an antenna in package.

Different implementations may implement different substrates with the via walls and/or fin structures. The substrate may include a laminate substrate, a coreless substrate and a substrate that includes a core layer. Different implementations may have a different number of integrated devices. It is noted that that the figures in the disclosure are not necessarily to scale.

FIGS. 2 and 3 illustrate that the packages 200 and 300 are configured to be electrically coupled to the board 290 through the plurality of solder interconnects 250. In some implementations, the packages 200 and 300 may include one or more antennas, which allow the packages 200 and 300 to transmit and receive signals (e.g., radiated signals) to and from the board 290 and/or other devices and components. Thus, in some implementations, some or all of the signals (e.g., I/O signals) between the package (e.g., 200, 300) and the board 290 (or other devices and packages), may bypass the solder interconnects 250. Thus, in some implementations, the solder interconnects 250 may be optional.

Figure 4:
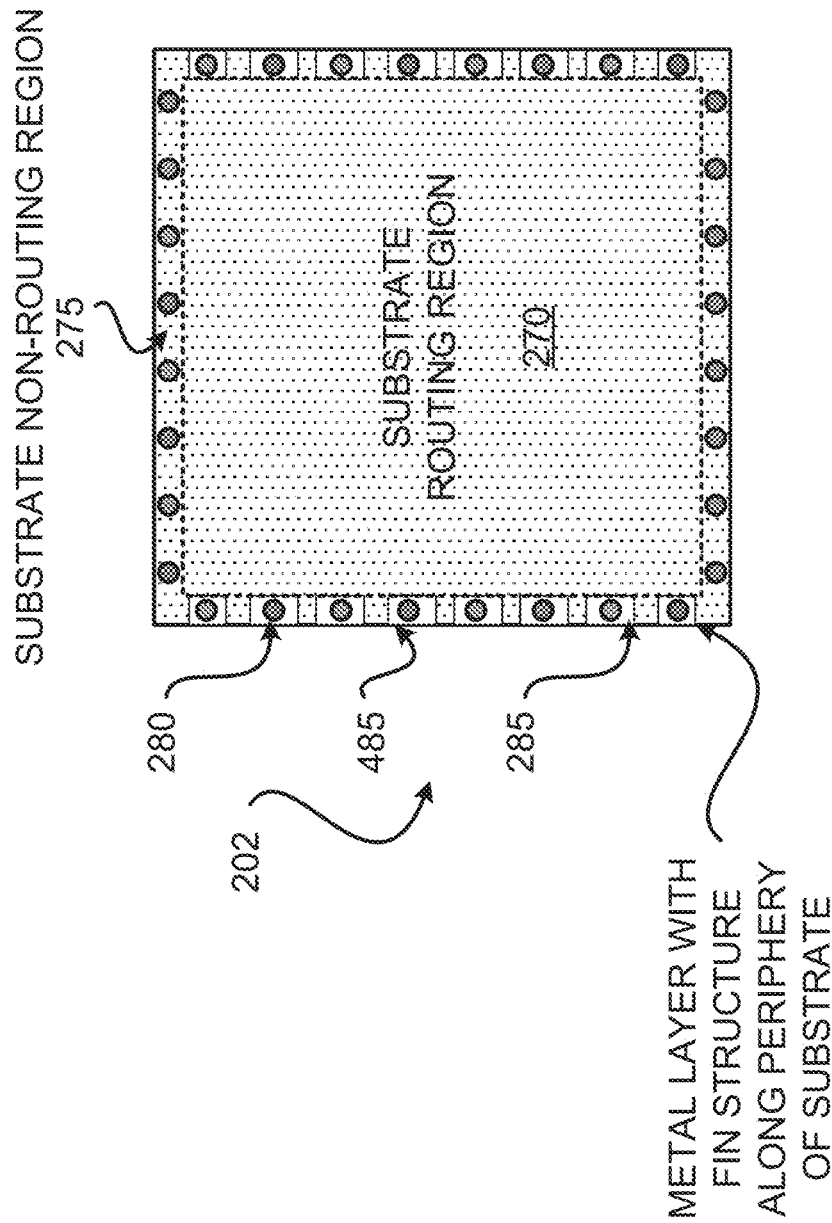
FIG. 4 illustrates a plan view of a substrate having a via wall and a fin structure configured as a shield.

FIG. 4 illustrates a plan view of the substrate 202. The substrate 202 includes the routing region 270 and the non-routing region 275. The non-routing region 275 is located along a periphery of the substrate 202. The non-routing region 275 of the substrate 202, includes the plurality of vias 280 configured as a shield (e.g., EMI shield). The non-routing region 275 of the substrate 202, also includes the fin structure 285 that is coupled to the plurality of vias 280. The fin structure 285 includes a plurality of fins 485 (e.g., repeating fins) that are spaced apart. The plurality of fins 485 may have the different shapes and/or different sizes. The plurality of fins 485 may be located on one or more metal layers of the substrate 202. The plurality of fins 485 may include an electrically conductive material (e.g., metal, copper). It is noted that some sides of the substrate 202 may not include a fin.

As mentioned above, the routing region 270 of the substrate 202, may include one or more continuous and/or contiguous regions that includes interconnects that are configured to be electrically coupled to integrated device(s). The routing region 270 may include an internal region, a center region, and/or a middle region of the substrate 202. As mentioned above, the non-routing region 275 of the substrate (e.g., 202, 302) may be defined as one or more regions along the periphery of a substrate, that is free of interconnects configured to be electrically coupled to integrated device(s). For example, the non-routing region 275 may be one or more regions that is free of interconnects configured to be electrical paths for power and/or signals (e.g., I/O signals). In some implementations, the non-routing region 275 of the substrate (e.g., 202, 302) may be defined as a region that is within 250 micrometers (µm) or less, from one or more outer edges of the substrate 202. For example, the non-routing region 275 of the substrate may be defined to include (i) a first region that is within 250 micrometers (µm) or less, of a first outer edge of the substrate, (ii) a second region that is within 250 micrometers (µm) or less, of a second outer edge of the substrate, (iii) a third region that is within 250 micrometers (µm) or less, of a third outer edge of the substrate, and/or (iv) a fourth region that is within 250 micrometers (µm) or less, of a fourth outer edge of the substrate. However, different implementations may define the non-routing region 275 of a substrate differently. The size and/or shape of the non-routing region 275 may vary with different implementations. In some implementations, the non-routing region 275 may be defined as one or more regions that is specified during IC design (e.g., during IC routing design and/or IC placement design) to be free of routes (e.g., routing interconnects) during the fabrication of a package. Thus, during IC routing design and/or IC placement design, routes coupled to integrated device(s), are not allowed to be specified in regions that are designated as a non-routing region. The non-routing region 275 may be located on one or more metal layers of the substrate. The non-routing region 275 may include interconnects that are not configured to be electrically coupled to integrated device (s) and/or passive device(s). In one aspect, all interconnects (e.g., pads, traces, through-vias) in the non-routing region 275 are not connected to power, input/output signaling, and integrated devices. The meaning of a non-routing region for a substrate may combine some or all of the definitions provided in the disclosure. A routing region (e.g., 270) may be defined as one or more regions (e.g., internal regions) that is allowed to have routes (e.g., interconnects) that are coupled to integrated devices. It is noted that portions of the routing region may not have interconnects, even though interconnects can be specified and/or formed there.

Figure 5:
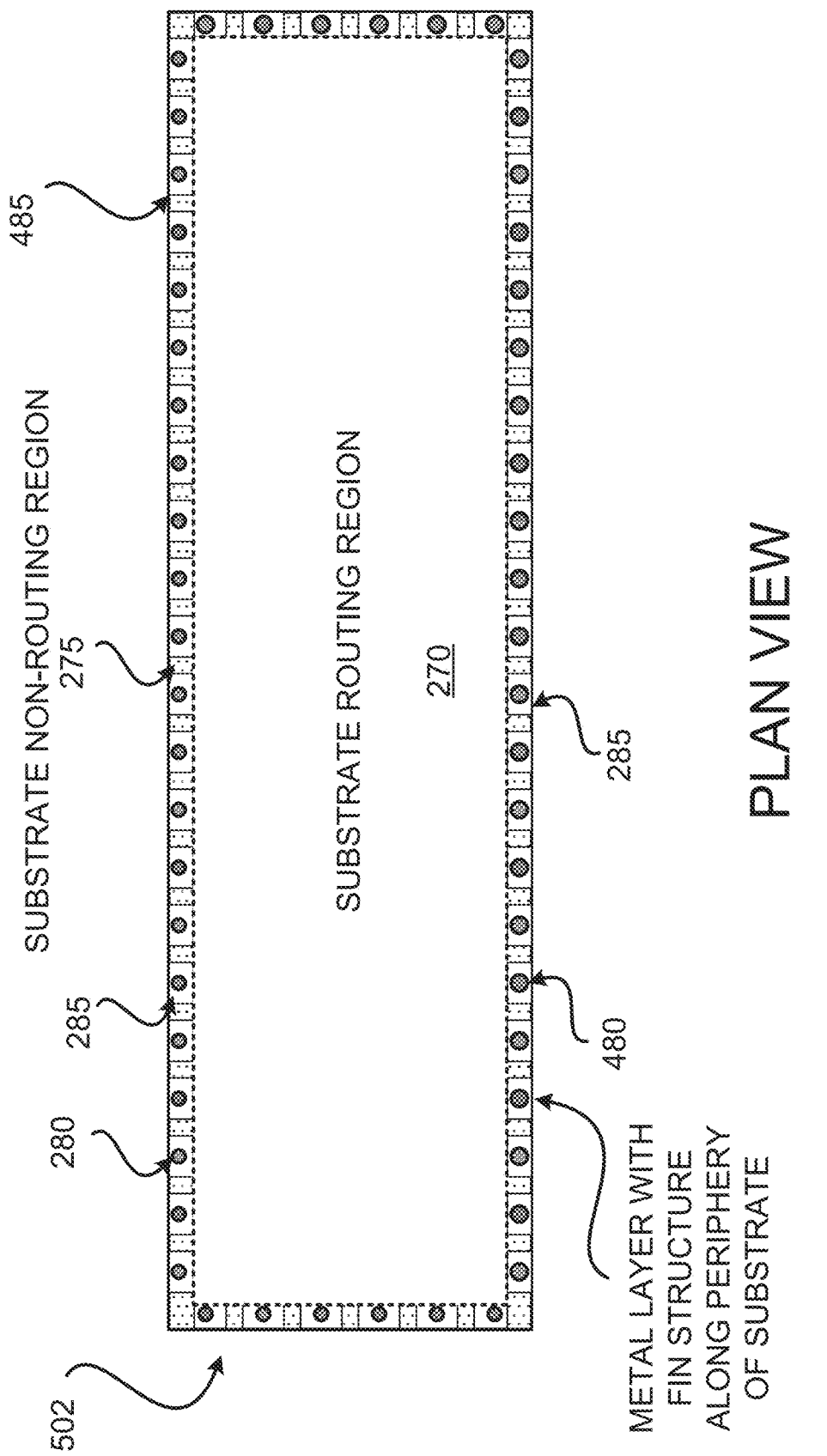
FIG. 5 illustrates a plan view of a substrate having a via wall and a fin structure configured as a shield.

FIG. 5 illustrates a plan view of the substrate 502. The substrate 502 includes the routing region 270 and the non-routing region 275. The non-routing region 275 is located along a periphery of the substrate 502. The non-routing region 275 of the substrate 502, includes the plurality of vias 280. The plurality of vias 280 may have different shapes and/or sizes. The non-routing region 275 of the substrate 202, also includes the fin structure 285 that is coupled to the plurality of vias 280. The fin structure 285 includes a plurality of fins 485 that are spaced apart.

Figure 6:
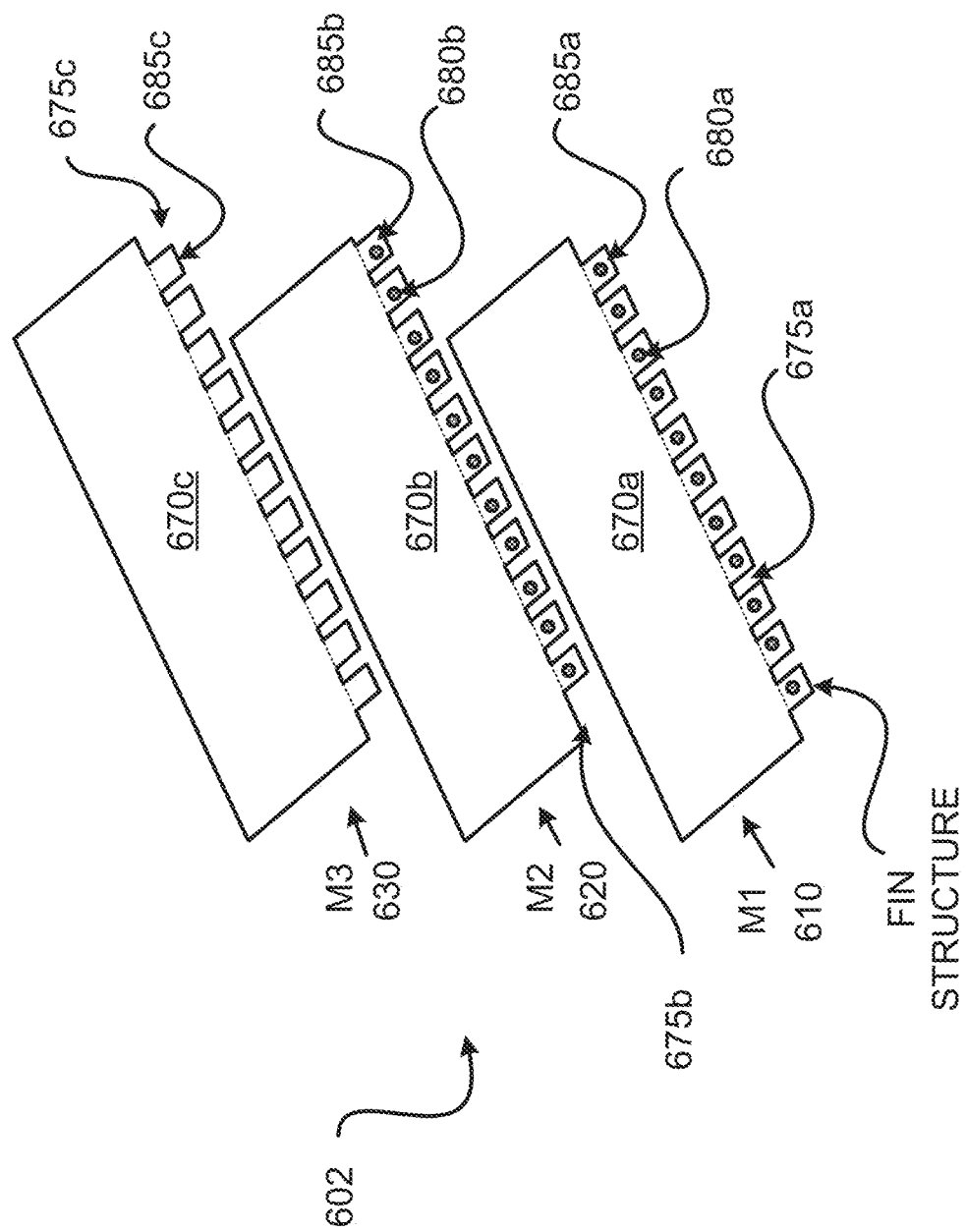
FIG. 6 illustrates an assembly view of a substrate having a via wall and a fin structure configured as a shield.

FIG. 6 illustrates an assembly view of a substrate 602. The substrate 602 includes a first metal layer (M1) 610, a second metal layer (M2) 620, and a third metal layer (M3) 630. The substrate 602 includes a first routing region 670a on the first metal layer 610, a second routing region 670b on the second metal layer 620 and a third routing region 670c on the third metal layer 630. The substrate 602 also includes a first non-routing region 675a on the first metal layer 610, a second non-routing region 675b on the second metal layer 620 and a third non-routing region 675c on the third metal layer 630. The first non-routing region 675a on the first metal layer 610, the second non-routing region 675b on the second metal layer 620 and the third non-routing region 675c on the third metal layer 630 are located on a periphery of the substrate 602.

The first non-routing region 675a includes a first fin structure 685a, the second non-routing region 675b includes the second fin structure 685b, the third non-routing region 675c includes the third fin structure 685c. The first fin structure 685a includes a plurality of repeating first fins, the second fin structure 685b includes a plurality of repeating second fins, and the third fin structure 685c includes a plurality of repeating third fins. The size, shape and/or location of the fins may be the same for all fins or may be different for at least some of the fins.

The first plurality of vias 680a is coupled to the first fin structure 685a and the second fin structure 685b. The second plurality of vias 680b is coupled to the second fin structure 685b and the third fin structure 685c.

Figure 7:
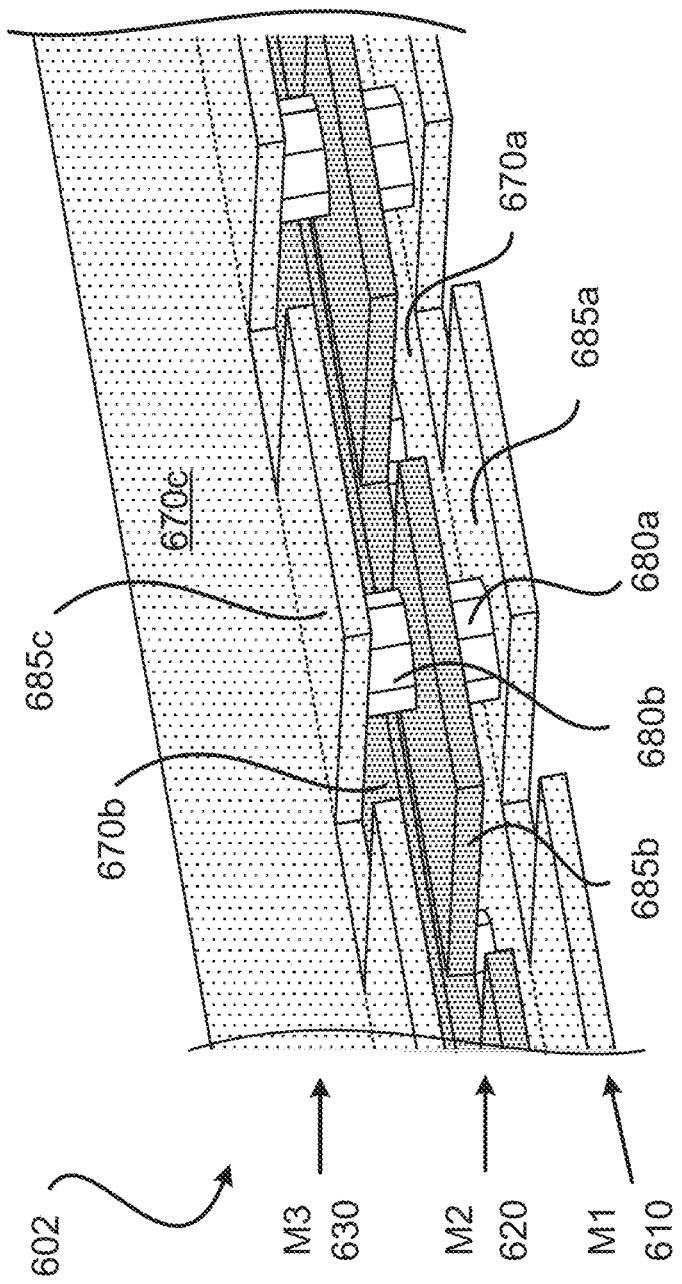
FIG. 7 illustrates a view of a via wall and a fin structure configured as a shield.

FIG. 7 illustrates a close-up view of the fin structures of the substrate 602 of FIG. 6. As shown in FIG. 7, a via from the first plurality of vias 680a is coupled to the first fin structure 685a and the second fin structure 685b. A via from the second plurality of vias 680b is coupled to the second fin structure 685b and the third fin structure 685c. The first fin structure 685a, the second fin structure 685b, the third fin structure 685c, the first plurality of vias 680a and the second plurality of vias 680b are located in a non-routing region of the substrate 602, where the non-routing region is located along a periphery of the substrate 602.

FIGS. 8 and 9 illustrate how different fin structures on different metal layers of a substrate may vertically overlap. FIG. 8 illustrates a first fin structure 885a on a first metal layer of a substrate and a second fin structure 885b on a second metal layer of a substrate. The first fin structure 885a and the second fin structure 885b may be located in the non-routing region of the substrate.

The first fin structure 885a includes a first plurality of repeating fins. For example, the first fin structure 885a includes a first fin 886a and a first fin 887a. The second fin structure 885b includes a second plurality of repeating fins. For example, the second fin structure 885b includes a second fin 886b and a second fin 887b. The first fin structure 885a and the second fin structure 885b are formed such that fins on different metal layers are offset from one another.

As shown in FIG. 8, the first fin 886a partially vertically overlaps with the second fin 886b, and the first fin 887a partially vertically overlaps with the second fin 887b. The via 880a is coupled to the first fin 886a and the second fin 886b. The via 882a is coupled to the first fin 887a and the second fin 887b. The via 880b and the via 882b are coupled to the second fin 886b. The via 884b is coupled to the second via 887b.

In some implementations, the fins of FIG. 8 may have a length of approximately 245 micrometers or less, and a width of approximately 200 micrometers or less. The fins of FIG. 8 may have a spacing of approximately 100 micrometers or less. The vias of FIG. 8 may have a pitch of approximately 300 micrometers.

FIG. 9 illustrates a first fin structure 985a on a first metal layer of a substrate and a second fin structure 985b on a second metal layer of a substrate. The first fin structure 985a and the second fin structure 985b may be located in the non-routing region of the substrate.

The first fin structure 985a includes a first plurality of repeating fins. For example, the first fin structure 985a includes a first fin 986a and a first fin 987a. The second fin structure 985b includes a second plurality of repeating fins. For example, the second fin structure 985b includes a second fin 986b and a second fin 987b. The first fin structure 985a and the second fin structure 985b are formed such that fins on different metal layers are offset from one another.

As shown in FIG. 9, the first fin 986a partially vertically overlaps with the second fin 986b, and the first fin 987a partially vertically overlaps with the second fin 987b. The via 980a is coupled to the first fin 986a and the second fin 986b. The via 982a is coupled to the first fin 987a and the second fin 887b. The via 980b is coupled to the second fin 986b. The via 982b is coupled to the second via 987b.

In some implementations, the fins of FIG. 9 may have a length of approximately 245 micrometers or less, and a width of approximately 300 micrometers or less. The fins of FIG. 9 may have a spacing of approximately 100 micrometers or less. The vias of FIG. 9 may have a pitch of approximately 200 micrometers.

Figure 10:
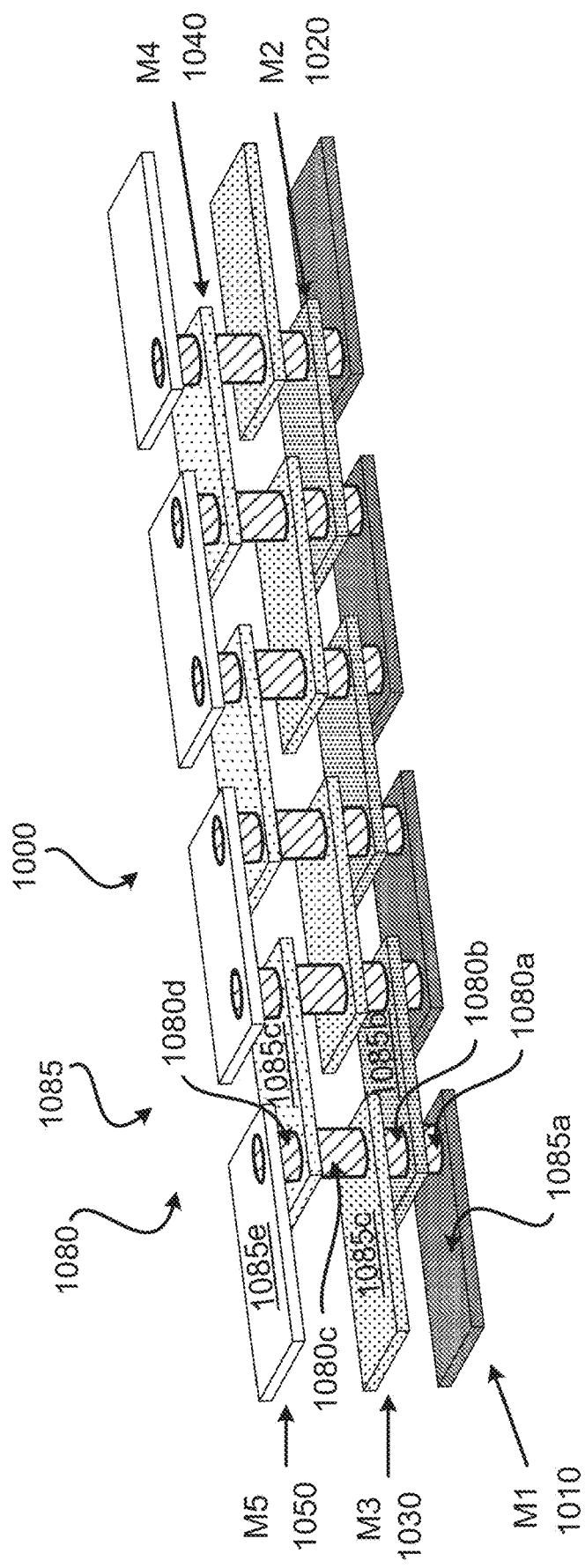
FIG. 10 illustrates a view of a via wall and a fin structure configured as a shield.

FIG. 10 illustrates a view of a non-routing region 1000 of a substrate (e.g., 202, 302) that includes a plurality of vias 1080 and the fin structure 1085 that are configured as a shield (e.g., EMI shield). The plurality of vias 1080 and the fin structure 1085 may be implemented in any of the substrates described in the disclosure. The non-routing region 1000 is located along a periphery of the substrate (e.g., 202, 302). The non-routing region 1000 includes a first metal layer (M1) 1010, a second metal layer (M2) 1020, a third metal layer (M3) 1030, a fourth metal layer (M4) 1040 and a fifth metal layer (M5) 1050. Different implementations may have a different number of metal layers in the non-routing region 1000 of the substrate.

As shown in FIG. 10, the plurality of vias 1080 includes a first plurality of via 1080a, a second plurality of vias 1080b, a third plurality of vias 1080c and a fourth plurality of vias 1080d. The fin structure 285 includes a first plurality of fins 1085a located on the first metal layer 1010, a second plurality of fins 1085b located on the second metal layer 1020, a third plurality of fins 1085c located on the third metal layer 1030, a fourth plurality of fins 1085d located on the first metal layer 1040 and a fifth plurality of fins 1085e located on the fifth metal layer 1050.

The first plurality of via 1080a is coupled to the first plurality of fins 1085a and the second plurality of fins 1085b. The second plurality of via 1080b is coupled to the second plurality of fins 1085b and the third plurality of fins 1085c. The third plurality of via 1080c is coupled to the third plurality of fins 1085c and the fourth plurality of fins 1085d. The fourth plurality of via 1080d is coupled to the fourth plurality of fins 1085d and the fifth plurality of fins 1085e.

Different implementations may arrange the vias and/or fins differently. In some implementations, the vias may be stacked and/or staggered. In FIGS. 7 and 10, the vias are stacked approximately above one another. However, in some implementations, the vias may be staggered and/or offset. The shape, size and/or the number of fins may vary with different implementations. In some implementations for example, instead of multiple fins, there may be one fin that takes up the entire metal layer of the non-routing region of the substrate. In some implementations, different metal layers may have different fin designs, different configurations, and/or different number of fins. A fin structure may be a structure that is defined on one or more metal layers. Thus, a fin structure may be defined by fin(s) on one metal layer, or by fins on two or more metal layers. A fin structure may be defined by several fin structures.

Exemplary Substrate Having a Via Wall and Fin Structure Configured as a Shield

Figure 11A:
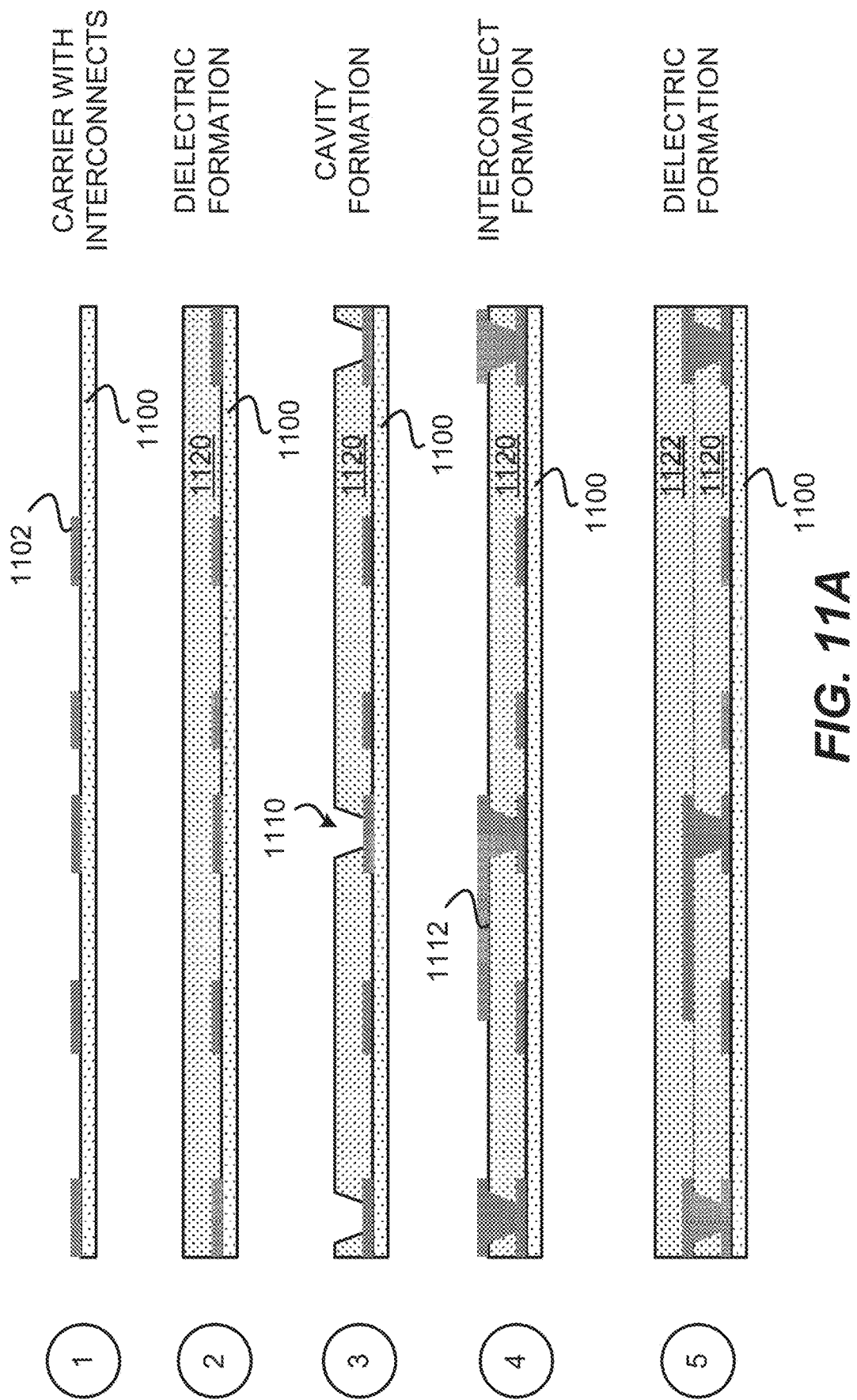
FIG. 11 (comprising FIGS. 11A-11C) illustrates an exemplary sequence for fabricating a substrate comprising a via wall and a fin structure configured as a shield.
Figure 11B:
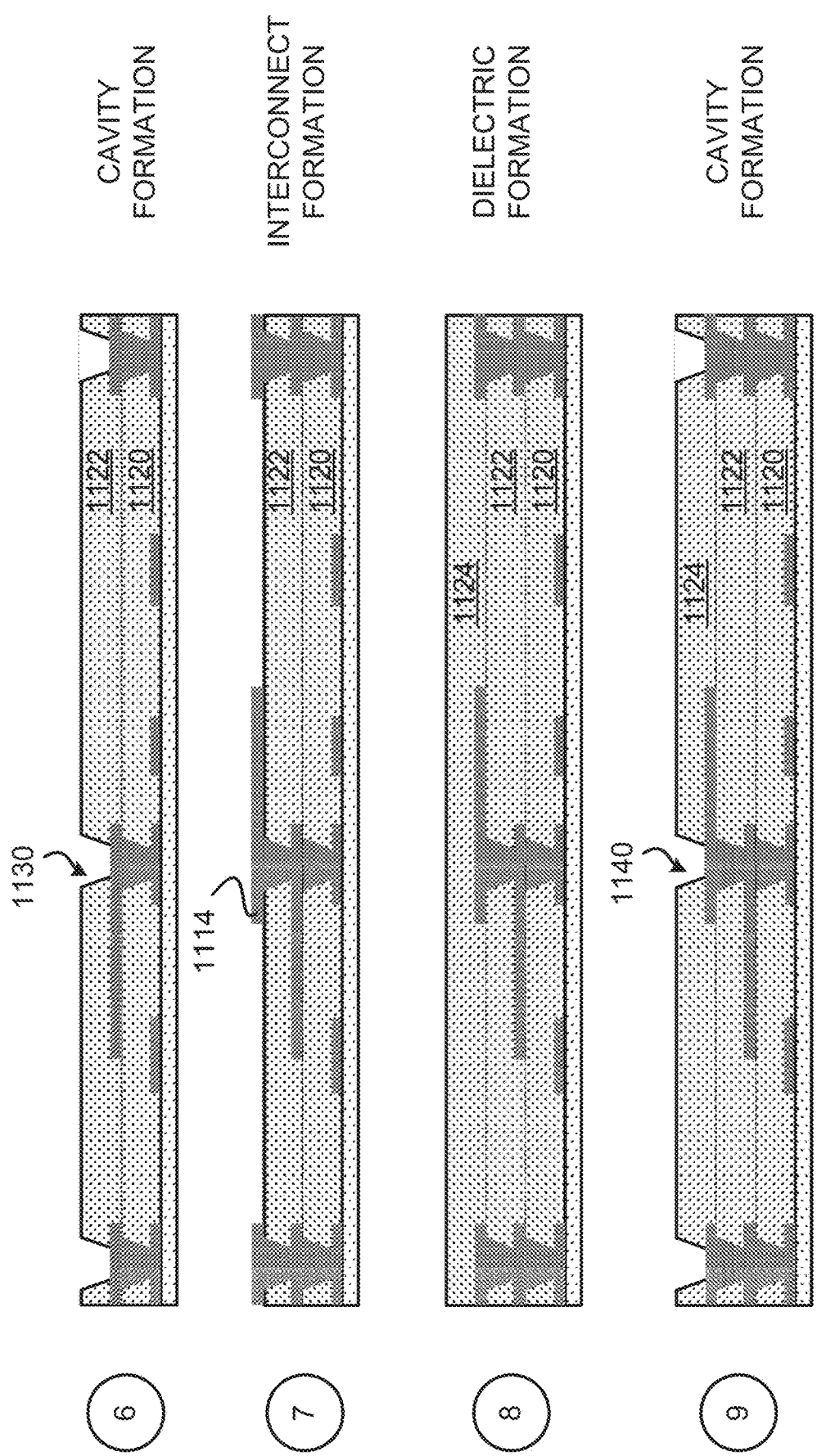
Figure 11C:
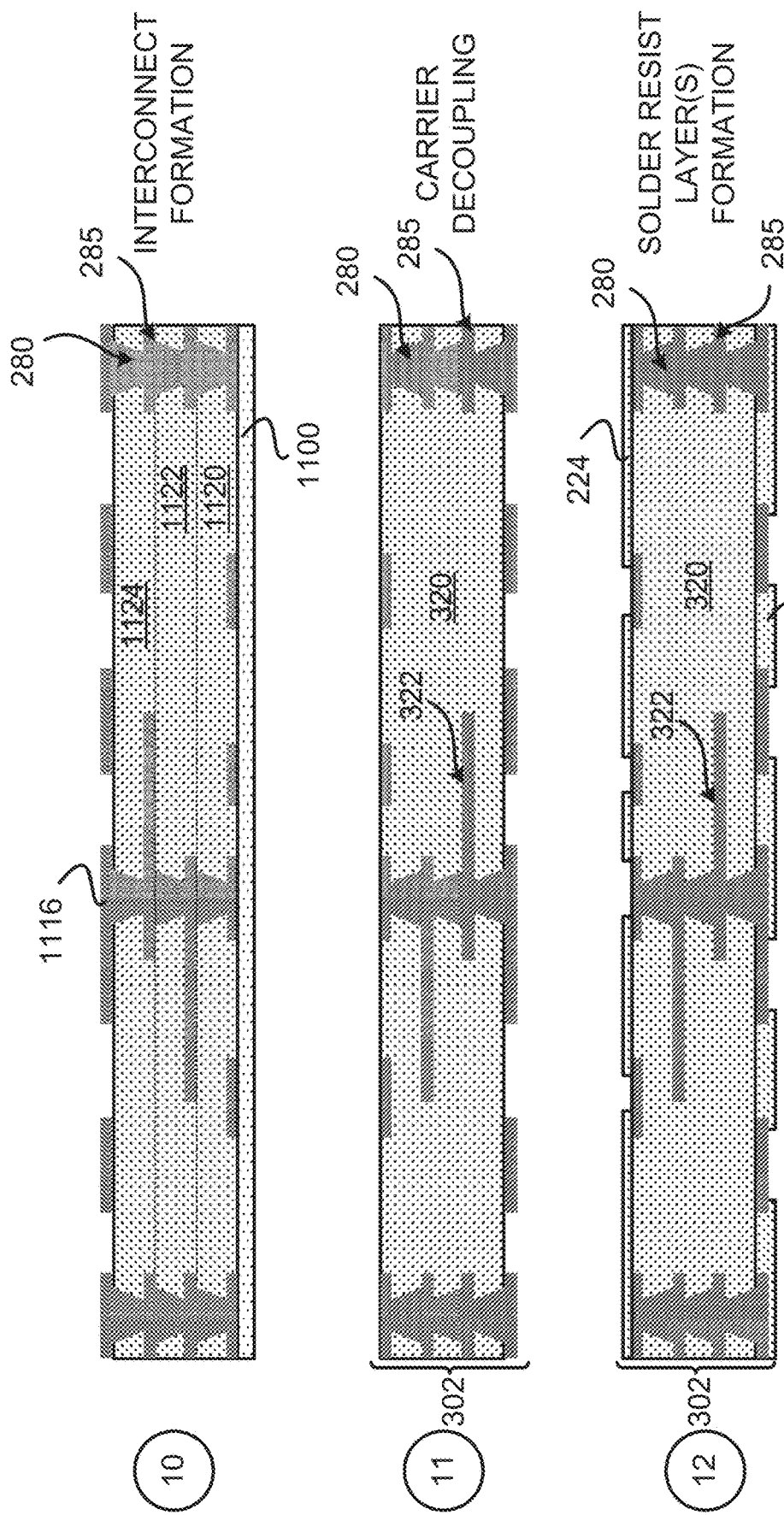

In some implementations, fabricating a substrate includes several processes. FIG. 11 (which includes FIGS. 11A-11C) illustrates an exemplary sequence for providing or fabricating a substrate that includes a via wall and a fin structure. In some implementations, the sequence of FIGS. 11A-11C may be used to provide or fabricate the substrate 302 with via walls and a fin structure of FIG. 3. However, the process of FIG. 11 may be used to fabricate any of the substrates described in the disclosure.

It should be noted that the sequence of FIGS. 11A-11C may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 11A, illustrates a state after a carrier 1100 is provided and a metal layer is formed over the carrier 1100. The metal layer may be patterned to form interconnects 1102. A plating process and etching process may be used to form the metal layer and interconnects.

Stage 2 illustrates a state after a dielectric layer 1120 is formed over the carrier 1100 and the interconnects 1102. The dielectric layer 1120 may include polyimide. However, different implementations may use different materials for the dielectric layer. A deposition process or a coating process may be used to form the dielectric layer.

Stage 3 illustrates a state after a plurality of cavities 1110 is formed in the dielectric layer 1120. The plurality of cavities 1110 may be formed using an etching process (e.g., photo etching process) or laser process.

Stage 4 illustrates a state after interconnects 1112 are formed in and over the dielectric layer 1120. For example, a via, pad and/or traces may be formed. A plating process may be used to form the interconnects.

Stage 5 illustrates a state after another dielectric layer 1122 is formed over the dielectric layer 1120. The dielectric layer 1122 may be the same material as the dielectric layer 1120. However, different implementations may use different materials for the dielectric layer. A deposition process or a coating process may be used to form the dielectric layer.

Stage 6, as shown in FIG. 11B, illustrates a state after a plurality of cavities 1130 is formed in the dielectric layer 1122. An etching process or laser process may be used to form the cavities 1130.

Stage 7 illustrates a state after interconnects 1114 are formed in and over the dielectric layer 1122. For example, via, pad and/or trace may be formed. A plating process may be used to form the interconnects.

Stage 8 illustrates a state after another dielectric layer 1124 is formed over the dielectric layer 1122. The dielectric layer 1124 may be the same material as the dielectric layer 1120. However, different implementations may use different materials for the dielectric layer. A deposition process or a coating process may be used to form the dielectric layer.

Stage 9 illustrates a state after a plurality of cavities 1140 is formed in the dielectric layer 1124. An etching process or laser process may be used to form the cavities 1140.

Stage 10, as shown in FIG. 11C, illustrates a state after interconnects 1116 are formed in and over the dielectric layer 1124. For example, via, pad and/or trace may be formed. A plating process may be used to form the interconnects.

Some of the interconnects 1102, 1112, 1114 and/or 1116 may define the plurality of vias 280 and/or the fin structure 285 that are located in a non-routing region along a periphery of the substrate. Other interconnects from the interconnects 1102, 1112, 1114 and/or 1116 may define the plurality of interconnects 322 in the routing region of the substrate.

Stage 11 illustrates a state after the carrier 1100 is decoupled (e.g., removed, grinded out) from the dielectric layer 1120, leaving the substrate 302 (e.g., coreless substrate). In some implementation, the coreless substrate is an embedded trace substrate (ETS). Stage 11 illustrates the substrate 302 with the at least one dielectric layer 320, which may represent the dielectric layer 1120, the dielectric layer 1122, and the dielectric layer 1124. In some implementations, the dielectric layer 1120, the dielectric layer 1122, and the dielectric layer 1124 may be considered as one dielectric layer (e.g., single dielectric layer). The substrate 302 includes the plurality of vias 280 and the fin structure 285, which may each be formed by some interconnects from the interconnects (e.g., 1102, 1112, 1114, 1116). The plurality of vias 280 and/or the fin structure 285 may be configured as a shield (e.g., EMI shield).

Stage 12 illustrates a state after the first solder resist layer 224 and the second solder resist layer 226 are formed over the substrate 302.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 12:
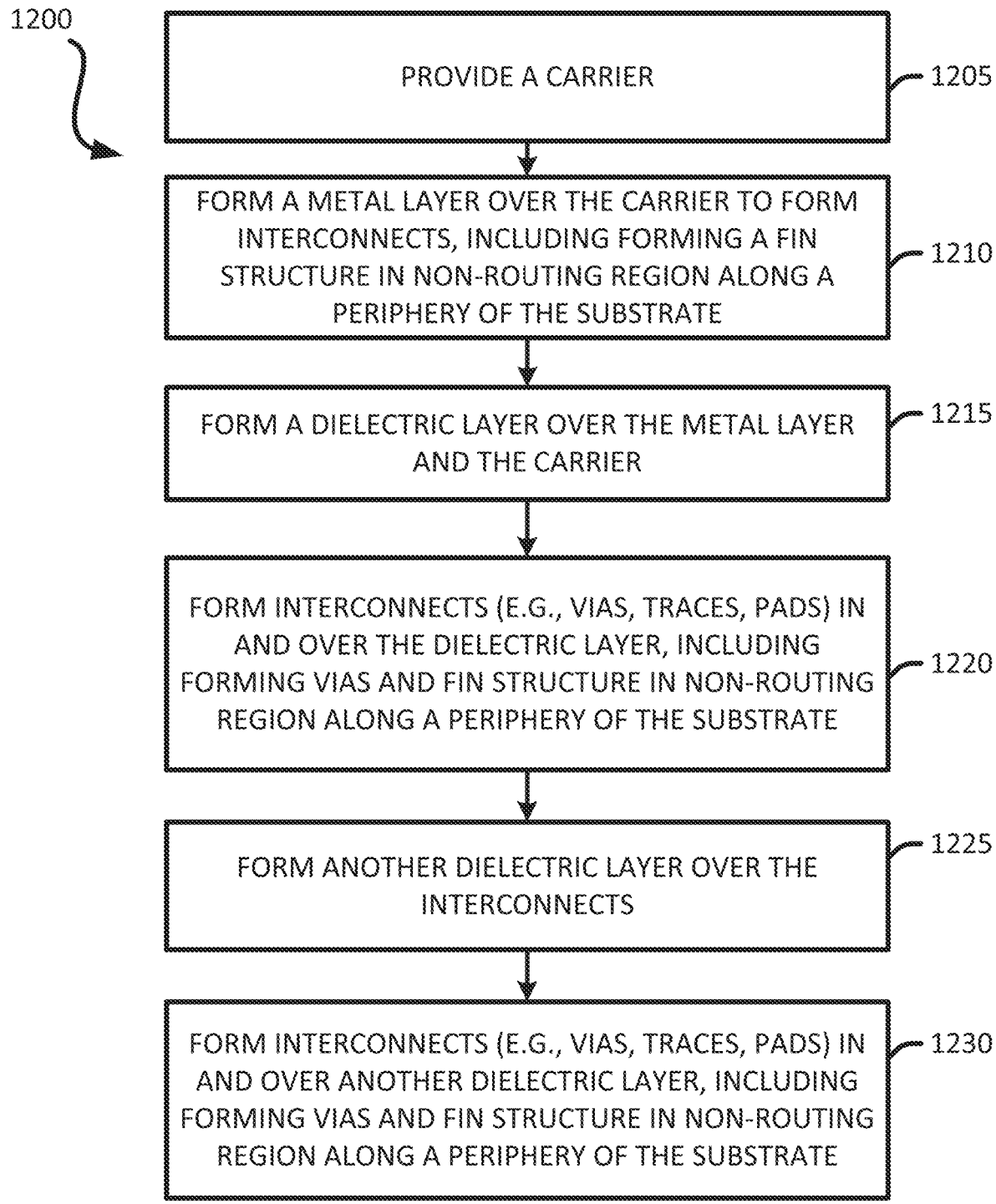
FIG. 12 illustrates an exemplary flow diagram of a method for fabricating a substrate comprising a via wall and a fin structure configured as a shield.

Exemplary Flow Diagram of a Method For Fabricating a Substrate Having a Via Wall and Fin Structure Configured as a Shield In some implementations, fabricating a substrate includes several processes. FIG. 12 illustrates an exemplary flow diagram of a method 1200 for providing or fabricating a substrate having a via wall and/or a fin structure. In some implementations, the method 1200 of FIG. 12 may be used to provide or fabricate the substrate of FIG. 3. For example, the method of FIG. 12 may be used to fabricate the substrate 302. However, the method 1300 may be used to fabricated any of the substrate that includes a via wall and/or a fin structure.

It should be noted that the sequence of FIG. 12 may combine one or more processes in order to simplify and/or clarify the method for providing or fabricating a substrate with a via wall and/or a fin structure. In some implementations, the order of the processes may be changed or modified.

The method provides (at 1205) a carrier 1100. Different implementations may use different materials for the carrier. The carrier may include a substrate, glass, quartz and/or carrier tape. Stage 1 of FIG. 11A illustrates a state after a carrier is provided.

The method forms (at 1210) a metal layer over the carrier 1100. The metal layer may be patterned to form interconnects. A plating process may be used to form the metal layer and interconnects. Stage 1 of FIG. 11A illustrates a state after a metal layer and interconnects 1102 are formed. The metal layer may include a fin structure that is formed and located along a region that is or will become the periphery of a substrate. The region may be a non-routing region of the substrate.

The method forms (at 1215) a dielectric layer 1120 over the carrier 1100 and the interconnects 1102. The dielectric layer 1120 may include polyimide. A deposition process or a coating process may be used to form the dielectric layer. Forming the dielectric layer may also include forming a plurality of cavities (e.g., 1110) in the dielectric layer 1120. The plurality of cavities may be formed using an etching process (e.g., photo etching) or laser process. Stages 2-3 of FIG. 11A illustrate forming a dielectric layer and cavities in the dielectric layer.

The method forms (at 1220) interconnects in and over the dielectric layer. For example, the interconnects 1112 may be formed in and over the dielectric layer 1120. A plating process may be used to form the interconnects. Forming interconnects may include providing a patterned metal layer over and/or in the dielectric layer. Forming the interconnects may include forming a plurality of vias 280 and/or a fin structure 285 along a region that is or will become the periphery of a substrate. The region may be a non-routing region of the substrate. Stage 4 of FIG. 11A illustrates an example of forming interconnects in and over a dielectric layer.

The method forms (at 1225) a dielectric layer 1122 over the dielectric layer 1120 and the interconnects. The dielectric layer 1122 may include polyimide. A deposition process or a coating process may be used to form the dielectric layer. Forming the dielectric layer may also include forming a plurality of cavities (e.g., 1130) in the dielectric layer 1122. The plurality of cavities may be formed using an etching process or laser process. Stages 5-6 of FIGS. 11A-11B illustrate forming a dielectric layer and cavities in the dielectric layer.

The method forms (at 1230) interconnects in and/or over the dielectric layer. For example, the interconnects 1114 may be formed. A plating process may be used to form the interconnects. Forming interconnects may include providing a patterned metal layer over an in the dielectric layer. Forming the interconnects may include forming a plurality of vias 280 and/or a fin structure 285 along a region that is or will become the periphery of a substrate. The region may be a non-routing region of the substrate. Stage 7 of FIG. 11B illustrates an example of forming interconnects in and over a dielectric layer.

The method may form additional dielectric layer(s) and additional interconnects as described at 1225 and 1230. At least some of the interconnects that are formed in the substrate may define a plurality of vias 280 and/or a fin structure 285 that is/are configured as a shield (e.g., EMI shield). Stages 8-10 of FIG. 11B-11C illustrate an example of forming interconnects in and over a dielectric layer, where a plurality of vias 280 and/or a fin structure 285 may be formed along a region that is or will become the periphery of a substrate.

Once all the dielectric layer(s) and additional interconnects are formed, the method may decouple (e.g., remove, grind out) the carrier (e.g., 1100) from the dielectric layer 1120, leaving the substrate with a via wall and/or a fin structure. In some implementations, the method may form solder resist layers (e.g., 224, 226) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 13A:
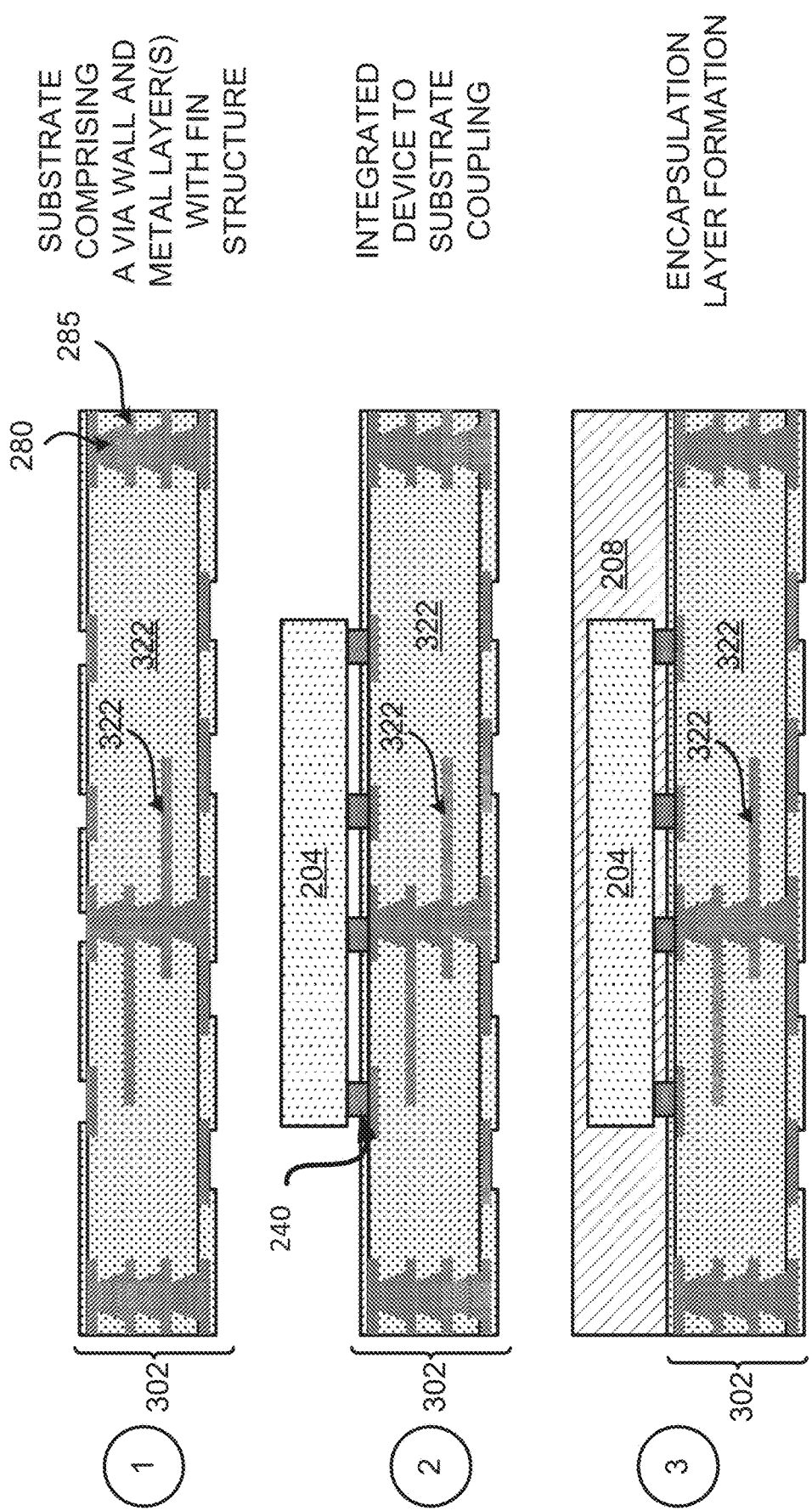
FIG. 13 (comprising FIGS. 13A-13B) illustrates an exemplary sequence for fabricating a package that includes a substrate comprising a via wall and a fin structure configured as a shield.
Figure 13B:
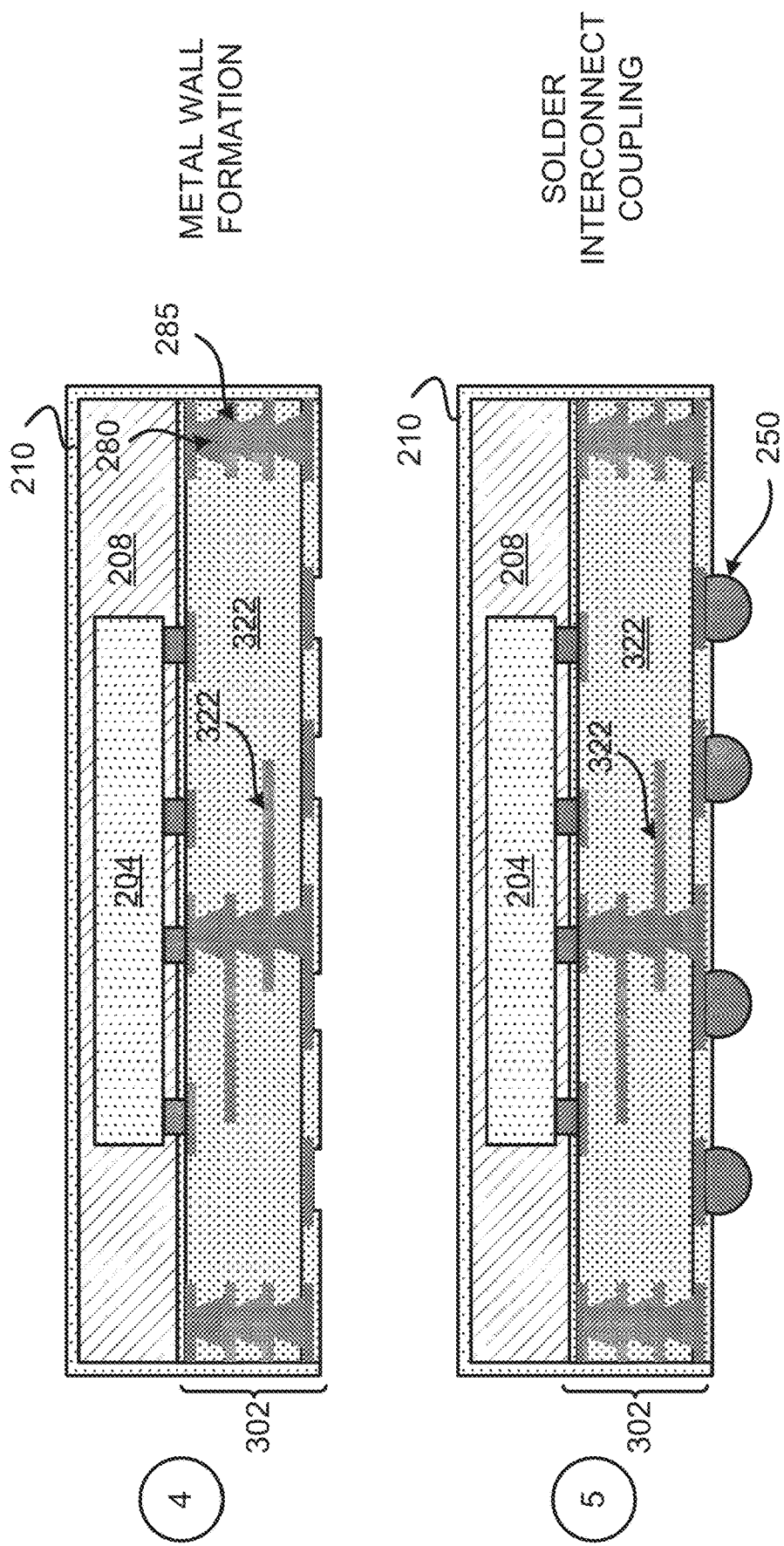

Exemplary Sequence for Fabricating a Package That Includes a Substrate Having a Via Wall and Fin Structure Configured as a Shield FIG. 13 (which includes FIGS. 13A-13B) illustrates an exemplary sequence for providing or fabricating a package that includes a substrate that includes a via wall and/or a fin structure. The via wall and/or the fin structure may be configured as a shield (e.g., EMI shield). In some implementations, the sequence of FIGS. 13A-13B may be used to provide or fabricate the package 300 that includes the substrate 302 of FIG. 3, or any of the packages described in the disclosure.

It should be noted that the sequence of FIGS. 13A-13B may combine one or more stages in order to simplify and/or clarify the sequence for providing or fabricating the package that includes a substrate that includes a via wall and/or a fin structure. In some implementations, the order of the processes may be changed or modified. In some implementations, one or more of processes may be replaced or substituted without departing from the spirit of the disclosure. The sequence of FIGS. 13A-13B may be used to fabricate one package or several packages at a time (as part of a wafer).

Stage 1, as shown in FIG. 13A, illustrates a state after the substrate 302 is provided. The substrate 302 may be provided by a supplier or fabricated. The substrate may include via walls and/or a fin structure. A process similar to the process shown in FIGS. 11A-11C may be used to fabricate the substrate 302. However, different implementations may use different processes to fabricate the substrate 302. Examples of processes that may be used to fabricate the substrate 302 include a semi-additive process (SAP) and a modified semi-additive process (mSAP). The substrate 302 includes at least one dielectric layer 320, a plurality of interconnects 322, the plurality of vias 280 and the fin structure 285.

Stage 2 illustrates a state after the integrated device 204 is coupled to the substrate 302. The integrated device 204 is coupled to the substrate 302 through the plurality of solder interconnects 240. The plurality of solder interconnects 240 may be coupled to interconnects from the plurality of interconnects 322 of the substrate 202. The integrated device 204 may be coupled to the substrate 302 such that the front side (e.g., active side) of the integrated device 204 is facing the substrate 302.

Stage 3 illustrates a state after the encapsulation layer 208 is provided (e.g., formed) over the substrate 302 such that the encapsulation layer 208 encapsulates the integrated device 204. The encapsulation layer 208 laterally surrounds the integrated device 204. The process of forming and/or disposing the encapsulation layer 208 may include using a compression and transfer molding process, a sheet molding process, or a liquid molding process. The encapsulation layer 208 may include a mold, a resin, an epoxy and/or polymer.

Stage 3 may illustrate a state after singulation, where a wafer that includes several substrates 302, integrated devices 204, and encapsulation layers 208 are diced (e.g., sliced) into individual packages. A mechanical process (e.g., saw) may be used to perform singulation.

Stage 4, as shown in FIG. 13B, illustrates a state after a metal layer 210 is formed over the side of the substrate 302 and a surface of the encapsulation layer 208. A sputtering process may be used to form the metal layer 210. The metal layer 210 may be an external metal layer and/or external metal wall. The metal layer 210 may include an electrically conductive material. The metal layer 210 may be formed such that the metal layer 210 is coupled to the plurality of vias 280 and/or the fin structure 285. The metal layer 210, the plurality of vias 280 and/or the fin structure 285 may be configured as a shield (e.g., EMI shield). Stage 4 may illustrate the package 300.

Stage 5 illustrates a state after the plurality of solder interconnects 250 is coupled to the substrate 302. The plurality of solder interconnects 250 may be coupled to the plurality of interconnects 322.

The packages (e.g., 200, 300) described in the disclosure may be fabricated one at a time or may be fabricated together as part of one or more wafers and then singulated into individual packages.

Figure 14:
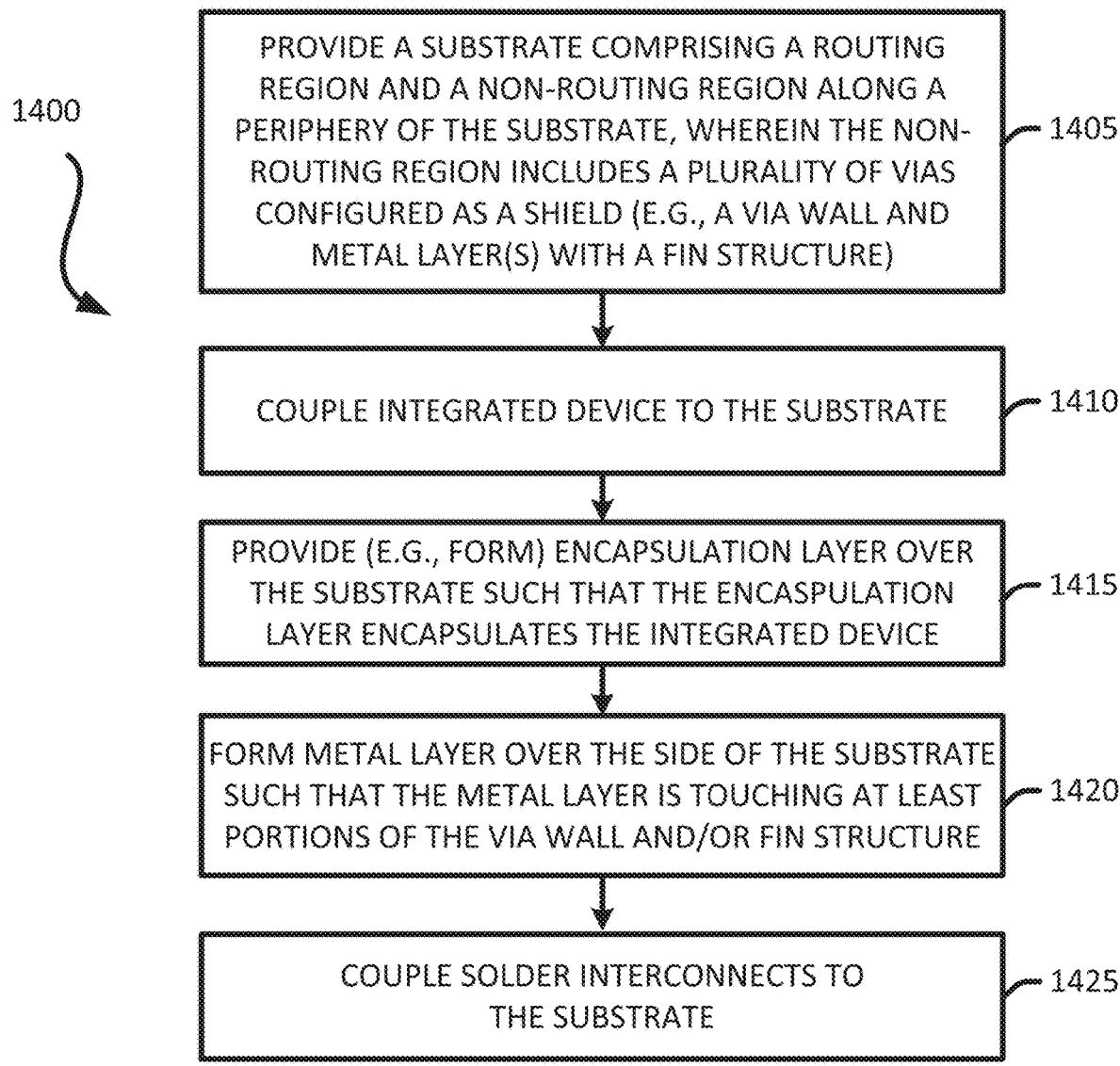
FIG. 14 illustrates an exemplary flow diagram of a method for fabricating a package that includes a substrate comprising a via wall and a fin structure configured as a shield.

Exemplary Flow Diagram of a Method For Fabricating a Package That Includes a Substrate Having a Via Wall and Fin Structure Configured as a Shield In some implementations, fabricating a package that includes a substrate that includes a via wall and/or a fin structure. The via wall and/or the fin structure may be configured as a shield (e.g., EMI shield) includes several processes. FIG. 14 illustrates an exemplary flow diagram of a method 1400 for providing or fabricating a package that includes a substrate that includes a via wall and/or a fin structure. The via wall and/or the fin structure may be configured as a shield (e.g., EMI shield). In some implementations, the method 1400 of FIG. 14 may be used to provide or fabricate the package 300 of FIG. 3 described in the disclosure. However, the method 1400 may be used to provide or fabricate any of the packages described in the disclosure.

It should be noted that the sequence of FIG. 14 may combine one or more processes in order to simplify and/or clarify the method for providing or fabricating a package that includes a substrate that includes a via wall and/or a fin structure. The via wall and/or the fin structure may be configured as a shield (e.g., EMI shield). In some implementations, the order of the processes may be changed or modified.

The method provides (at 1405) a substrate (e.g., 302). The substrate 302 may be provided by a supplier or fabricated. The substrate includes a routing region and a non-routing region along a periphery of the substrate, where the non-routing region includes a plurality of vias configured as a shield. The substrate may include a via wall (e.g., plurality of vias 280) and/or a fin structure (e.g., 285). The via wall and/or the fin structure may be configured as a shield (e.g., EMI shield). Different implementations may provide different substrates. A process similar to the process shown in FIGS. 11A-11C may be used to fabricate the substrate 302. However, different implementations may use different processes to fabricate the substrate 302. The substrate 302 includes at least one dielectric layer 320 and a plurality of interconnects 322. Stage 1 of FIG. 13A illustrates and describes an example of providing a substrate with a via wall and a fin structure in a non-routing region of the substrate.

The method couples (at 1410) the integrated device (e.g., 204) to the substrate (e.g., 302). The integrated device 204 may be coupled to the substrate 302 through the plurality of solder interconnects 240. The plurality of solder interconnects 240 may be coupled to interconnects from the plurality of interconnects 322 of the substrate 302. The integrated device 204 may be coupled to the substrate 302 such that the front side (e.g., active side) of the integrated device 204 is facing the substrate 302. Stage 2 of FIG. 13B illustrates and describes an example of an integrated device being coupled to a substrate.

The method provides (at 1415) an encapsulation layer (e.g., 208) over the substrate (e.g., 302) such that the encapsulation layer 208 encapsulates the integrated device 204. The encapsulation layer 208 may laterally surround the integrated device 204. Stage 3 of FIG. 13A, illustrates and describes an example of an encapsulation layer that is located over the substrate and encapsulates the integrated device.

The method forms (at 1420) a metal layer (e.g., 210) over the side portion of the substrate (e.g., 302) and a surface of the encapsulation layer (e.g., 208). A sputtering process may be used to form the metal layer 210. The metal layer 210 may be an external metal layer. The metal layer 210 may include an electrically conductive material. The metal layer 210 may be formed such that the metal layer 210 is coupled to the plurality of vias 280 and/or the fin structure 285. The metal layer 210, the plurality of vias 280 and/or the fin structure 285 may be configured as a shield (e.g., EMI shield). Stage 4 of FIG. 13B may illustrate a state after a metal layer is formed over the side of the substrate and a surface of the encapsulation layer.

The method couples (at 1425) solder interconnects (e.g., 250) to the substrate 302. The solder interconnects 250 may be coupled to the plurality of interconnects 322. Stage 5 of FIG. 13B illustrates an example of solder interconnects coupled to a substrate.

Exemplary Electronic Devices

Figure 15:
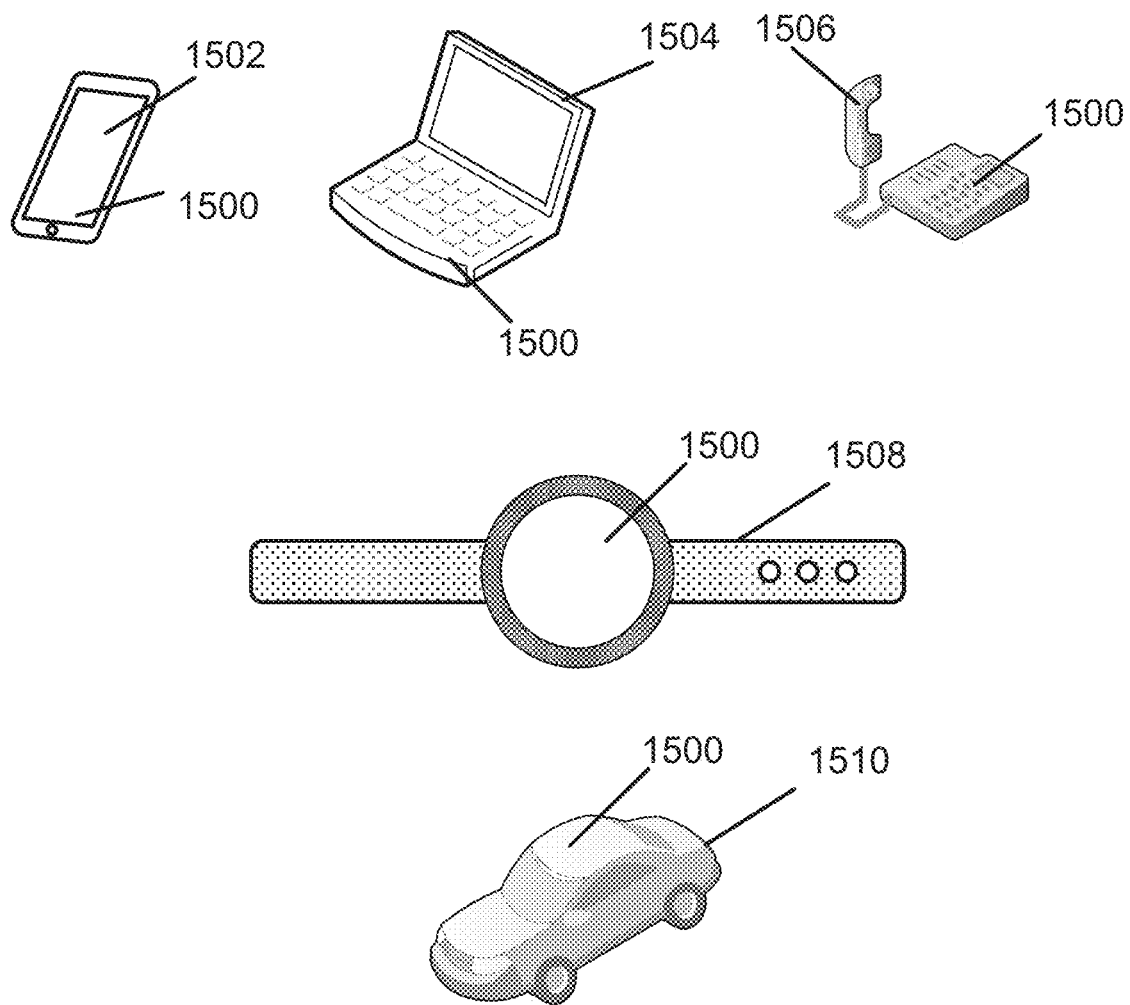
FIG. 15 illustrates various electronic devices that may integrate a die, an integrated device, an integrated passive device (IPD), a passive component, a package, and/or a device package described herein.

FIG. 15 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1502, a laptop computer device 1504, a fixed location terminal device 1506, a wearable device 1508, or automotive vehicle 1510 may include a device 1500 as described herein. The device 1500 may be, for example, any of the devices and/or integrated circuit (IC) packages described herein. The devices 1502, 1504, 1506 and 1508 and the vehicle 1510 illustrated in FIG. 15 are merely exemplary. Other electronic devices may also feature the device 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-10, 11A-11C, 12, 13A-13B, and/or 14-15 may be rearranged and/or combined into a single component, process, feature or function or embodied in several components, processes, or functions.

Additional elements, components, processes, and/or functions may also be added without departing from the disclosure. It should also be noted FIGS. 2-10, 11A-11C, 12, 13A-13B, and/or 14-15 and its corresponding description in the present disclosure is not limited to dies and/or ICs. In some implementations, FIGS. 2-10, 11A-11C, 12, 13A-13B, and/or 14-15 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising a routing region and a non-routing region along a periphery of the substrate, wherein the non-routing region comprises a plurality of vias configured as a shield, the substrate further comprising:
a first metal layer comprising a first fin structure in the non-routing region; and
a second metal layer comprising a second fin structure in the non-routing region, wherein the plurality of vias are coupled to the first fin structure and the second fin structure;
a metal layer located over a side portion of the substrate such that the metal layer is coupled to the first fin structure and the second fin structure;
an integrated device coupled to the substrate; and
an encapsulation layer located over the substrate such that the encapsulation layer encapsulates the integrated device.

2. The package of claim 1, wherein the plurality of vias are configured to be free of electrical connection with the integrated device.

3. The package of claim 1,
wherein the routing region of the substrate includes a plurality of interconnects configured to be electrically coupled to the integrated device, and
wherein the non-routing region along the periphery of the substrate is a region of the substrate that is free of interconnects electrically coupled to the integrated device.

4. The package of claim 1, wherein the substrate further comprises a third metal layer comprising a third fin structure in the non-routing region, wherein the plurality of vias are coupled to the third fin structure.

5. The package of claim 1, wherein the first fin structure includes a plurality of repeating first fins in the non-routing region, wherein the second fin structure includes a plurality of repeating second fins in the non-routing region, and wherein the plurality of repeating second fins are offset from the plurality of repeating first fins.

6. The package of claim 1, wherein the metal layer is further located over a surface of the encapsulation layer.

7. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

8. An apparatus comprising:
a substrate comprising a routing region and a non-routing region along a periphery of the substrate, wherein the non-routing region comprises means for via shielding, the substrate further comprising:
a first metal layer comprising a first means for fin shielding in the non-routing region; and
a second metal layer comprising a second means for fin shielding in the non-routing region,
wherein the means for via shielding is coupled to the first means for fin shielding and the second means for fin shielding;
a metal layer located over a side portion of the substrate such that the metal layer is coupled to the first means for fin shielding and the second means for fin shielding;
an integrated device coupled to the substrate; and
means for encapsulation located over the substrate such that the means for encapsulation encapsulates the integrated device.

9. The apparatus of claim 8, wherein the means for via shielding is configured to be free of electrical connection with the integrated device.

10. The apparatus of claim 8,
wherein the routing region of the substrate includes a plurality of interconnects configured to be electrically coupled to the integrated device, and
wherein the non-routing region along the periphery of the substrate is a region of the substrate that is free of interconnects electrically coupled to the integrated device.

11. The apparatus of claim 8, wherein the substrate further comprises a third metal layer comprising a third means for fin shielding in the non-routing region, wherein the means for via shielding is coupled to the third means for fins shielding.

12. The apparatus of claim 8, wherein the first means for fin shielding includes a plurality of repeating first fins in the non-routing region, wherein the second means for fin shielding includes a plurality of repeating second fins in the non-routing region, and wherein the plurality of repeating second fins are offset from the plurality of repeating first fins.

13. The apparatus of claim 8, wherein the metal layer is further located over a surface of the means for encapsulation.

14. The apparatus of claim 8, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

15. A method for fabricating a package, comprising:
providing a substrate comprising a routing region and a non-routing region along a periphery of the substrate, wherein the non-routing region comprises a plurality of vias configured as a shield, the substrate further comprising:
a first metal layer comprising a first fin structure in the non-routing region; and
a second metal layer comprising a second fin structure in the non-routing region,
wherein the plurality of vias are coupled to the first fin structure and the second fin structure;
forming a metal layer located over a side portion of the substrate such that the metal layer is coupled to the first fin structure and the second fin structure;
coupling an integrated device to the substrate; and
forming an encapsulation layer over the substrate such that the encapsulation layer encapsulates the integrated device.

16. The method of claim 15, wherein the plurality of vias are configured to be free of electrical connection with the integrated device.

17. The method of claim 15,
wherein the routing region of the substrate includes a plurality of interconnects configured to be electrically coupled to the integrated device, and
wherein the non-routing region along the periphery of the substrate is a region of the substrate that is free of interconnects electrically coupled to the integrated device.

18. The method of claim 15, wherein forming the metal layer further comprising forming the metal layer over the encapsulation layer.

19. A package comprising: a substrate comprising a routing region and a non-routing region along a periphery of the substrate, wherein the non-routing region comprises a plurality of vias configured as a shield, the substrate further comprising:
a first metal layer comprising a first fin structure in the non-routing region; and
a second metal layer comprising a second fin structure in the non-routing region,
wherein the plurality of vias are coupled to the first fin structure and the second fin structure,
wherein the first fin structure includes a plurality of repeating first fins in the non-routing region,
wherein the second fin structure includes a plurality of repeating second fins in the non-routing region, and
wherein the plurality of repeating second fins are offset from the plurality of repeating first fins;
an integrated device coupled to the substrate; and
an encapsulation layer located over the substrate such that the encapsulation layer encapsulates the integrated device.

20. The package of claim 19, wherein the substrate further comprises a third metal layer comprising a third fin structure in the non-routing region, wherein the plurality of vias is coupled to the third fin structure.

21. The package of claim 19, further comprising a metal layer located over a side portion of the substrate such that the metal layer is coupled to the first fin structure.

22. The package of claim 21, wherein the metal layer is further located over a surface of the encapsulation layer.

* * * * *